US009406913B2

(12) United States Patent
Huang et al.

(10) Patent No.: US 9,406,913 B2
(45) Date of Patent: *Aug. 2, 2016

(54) BATTERY CASE FOR MOBILE DEVICES

(71) Applicant: Mophie, Inc., Tustin, CA (US)

(72) Inventors: Daniel Huang, Irvine, CA (US); Matthew Brand, Brooklyn, NY (US)

(73) Assignee: mophie, inc., Tustin, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/749,300

(22) Filed: Jun. 24, 2015

(65) Prior Publication Data
US 2015/0295439 A1  Oct. 15, 2015

Related U.S. Application Data

(60) Continuation of application No. 14/547,060, filed on Nov. 18, 2014, now Pat. No. 9,088,029, which is a continuation of application No. 12/938,351, filed on Nov. 2, 2010, now Pat. No. 8,971,039, which is a
(Continued)

(51) Int. Cl.
H05K 5/00 (2006.01)
H05K 7/00 (2006.01)
(Continued)

(52) U.S. Cl.
CPC ......... *H01M 2/1022* (2013.01); *G01R 31/3606* (2013.01); *G06F 1/1626* (2013.01);
(Continued)

(58) Field of Classification Search
CPC .. G06F 1/1626; G06F 1/1632; H04M 1/0254; H04M 1/0262; H04M 1/0283
USPC ......... 361/679.41, 679.55, 679.56; 206/308.3
See application file for complete search history.

(56) References Cited

U.S. PATENT DOCUMENTS 3,851,126 A 11/1974 Keller
4,028,515 A 6/1977 Desio et al.
(Continued)

FOREIGN PATENT DOCUMENTS

CN 201252577 Y 6/2009
CN 202364273 U 8/2012
(Continued)

OTHER PUBLICATIONS

International Preliminary Report on Patentability for PCT/US2014/017781, dated Aug. 25, 2015.
(Continued)

*Primary Examiner* — Anthony Haughton
(74) *Attorney, Agent, or Firm* — Knobbe, Martens, Olson & Bear, LLP

(57) ABSTRACT

A battery pack is provided for a mobile communication device, comprising a casing defining a cavity that conforms, at least partially, to the outer shape of the mobile communication device and one or more rechargeable power cells housed within the thickness of the casing. An internal interface engages a corresponding interface on the mobile communication device to provide power from the one or more rechargeable cells to the mobile communication device. An external interface is electrically coupled to the internal interface in order to transmit signals from the mobile communication device to an external device and may further serve to recharge the one or more rechargeable power cells. The battery pack may also serve as an extendible platform by providing additional integrated communication interfaces and/or processors that can be utilized by the mobile communication device to extend its communication and/or processing capabilities.

26 Claims, 21 Drawing Sheets

Related U.S. Application Data division of application No. 12/357,262, filed on Jan. 21, 2009, now Pat. No. 8,367,235.

(60) Provisional application No. 61/021,897, filed on Jan. 18, 2008.

(51) Int. Cl.

| | |
|---|---|
| G06F 1/16 | (2006.01) |
| H01M 2/10 | (2006.01) |
| H04M 1/02 | (2006.01) |
| H01M 10/46 | (2006.01) |
| H01M 10/48 | (2006.01) |
| H02J 7/00 | (2006.01) |
| G01R 31/36 | (2006.01) |
| H04B 1/3883 | (2015.01) |
| H04B 1/3888 | (2015.01) |

(52) U.S. Cl.
CPC .............. *G06F1/1632* (2013.01); *H01M 10/46* (2013.01); *H01M 10/488* (2013.01); *H02J 7/0042* (2013.01); *H02J 7/0044* (2013.01); *H02J 7/0045* (2013.01); *H02J 7/0047* (2013.01); *H02J 7/0052* (2013.01); *H04B 1/3883* (2013.01); *H04B 1/3888* (2013.01); *H04M 1/0254* (2013.01); *H04M 1/0262* (2013.01); *H04M 1/0283* (2013.01); *H01M 2220/30* (2013.01); *H02J 2007/005* (2013.01); *H02J 2007/0062* (2013.01); *Y10T 29/49108* (2015.01)

(56) References Cited

U.S. PATENT DOCUMENTS

| | | |
|---|---|---|
| D267,795 S | 2/1983 | Mallon |
| 4,479,596 A | 10/1984 | Swanson |
| 4,515,272 A | 5/1985 | Newhouse |
| D284,372 S | 6/1986 | Carpenter |
| 4,951,817 A | 8/1990 | Barletta et al. |
| D312,534 S | 12/1990 | Nelson et al. |
| 5,001,772 A | 3/1991 | Holcomb et al. |
| D322,719 S | 12/1991 | Jayez |
| D327,868 S | 7/1992 | Oka |
| 5,360,108 A | 11/1994 | Alagia |
| 5,368,159 A | 11/1994 | Doria |
| 5,383,091 A | 1/1995 | Snell |
| 5,386,084 A | 1/1995 | Risko |
| 5,508,123 A | 4/1996 | Fan |
| D372,896 S | 8/1996 | Nagele et al. |
| 5,586,002 A | 12/1996 | Notarianni |
| 5,604,050 A | 2/1997 | Brunette et al. |
| 5,610,979 A | 3/1997 | Yu |
| D384,327 S | 9/1997 | Nakui |
| 5,708,707 A | 1/1998 | Halttlunen et al. |
| 5,711,013 A | 1/1998 | Collett et al. |
| D392,248 S | 3/1998 | Johansson |
| D392,939 S | 3/1998 | Finke-Anlauff |
| 5,786,106 A | 7/1998 | Armani |
| 5,816,459 A | 10/1998 | Armistead |
| D400,495 S | 11/1998 | Deslyper et al. |
| D400,496 S | 11/1998 | Barber et al. |
| 5,859,481 A | 1/1999 | Banyas |
| 5,864,766 A | 1/1999 | Chiang |
| D405,801 S | 2/1999 | Nagele et al. |
| D407,063 S | 3/1999 | Reis et al. |
| 5,876,351 A | 3/1999 | Rohde |
| D407,708 S | 4/1999 | Nagele et al. |
| 5,896,277 A | 4/1999 | Leon et al. |
| 5,932,855 A | 8/1999 | Wang et al. |
| 5,959,433 A | 9/1999 | Rohde |
| 5,973,477 A | 10/1999 | Chang |
| D417,189 S | 11/1999 | Amero, Jr. et al. |
| 6,043,626 A | 3/2000 | Snyder et al. |
| D424,512 S | 5/2000 | Ho |
| 6,069,332 A | 5/2000 | Suchanek et al. |
| 6,081,595 A | 6/2000 | Picaud |
| D428,019 S | 7/2000 | Amron |
| 6,082,535 A | 7/2000 | Mitchell |
| 6,171,138 B1 | 1/2001 | Lefebvre et al. |
| D438,004 S | 2/2001 | Watson et al. |
| 6,184,654 B1 | 2/2001 | Bachner, III et al. |
| D439,218 S | 3/2001 | Yu |
| 6,201,867 B1 | 3/2001 | Koike |
| 6,208,115 B1 | 3/2001 | Binder |
| 6,266,539 B1 | 7/2001 | Pardo |
| D446,497 S | 8/2001 | Yu |
| 6,273,252 B1 | 8/2001 | Mitchell |
| D447,462 S | 9/2001 | Kosiba |
| 6,313,982 B1 | 11/2001 | Hino |
| 6,317,313 B1 | 11/2001 | Mosgrove et al. |
| 6,324,380 B1 | 11/2001 | Kiuchi et al. |
| 6,346,791 B1 | 2/2002 | Berguirdjian |
| 6,405,056 B1 | 6/2002 | Altschul et al. |
| D460,411 S | 7/2002 | Wang |
| D460,761 S | 7/2002 | Croley |
| 6,415,138 B2 | 7/2002 | Sirola et al. |
| 6,445,577 B1 | 9/2002 | Madsen et al. |
| 6,471,056 B1 | 10/2002 | Tzeng |
| D469,427 S | 1/2003 | Ma et al. |
| 6,536,589 B2 | 3/2003 | Chang |
| 6,538,413 B1 | 3/2003 | Beard et al. |
| D472,384 S | 4/2003 | Richardson |
| 6,552,513 B1 | 4/2003 | Li |
| 6,555,990 B1 | 4/2003 | Yang |
| 6,583,601 B2 | 6/2003 | Simoes et al. |
| 6,594,472 B1 | 7/2003 | Curtis et al. |
| 6,614,722 B2 | 9/2003 | Polany et al. |
| 6,626,362 B1 | 9/2003 | Steiner et al. |
| D481,716 S | 11/2003 | He et al. |
| D482,529 S | 11/2003 | Hardigg et al. |
| 6,646,864 B2 | 11/2003 | Richardson |
| D484,874 S | 1/2004 | Chang et al. |
| D485,834 S | 1/2004 | Davetas |
| 6,681,003 B2 | 1/2004 | Linder et al. |
| 6,701,159 B1 | 3/2004 | Powell |
| 6,708,887 B1 | 3/2004 | Garrett et al. |
| 6,714,802 B1 | 3/2004 | Barvesten |
| 6,785,566 B1 | 8/2004 | Irizarry |
| 6,819,549 B1 | 11/2004 | Lammers-Meis et al. |
| D500,041 S | 12/2004 | Tsujimoto |
| D506,612 S | 6/2005 | Rosa et al. |
| D508,495 S | 8/2005 | Bone et al. |
| D513,123 S | 12/2005 | Richardson et al. |
| 6,980,777 B2 | 12/2005 | Shepherd et al. |
| D513,451 S | 1/2006 | Richardson et al. |
| 6,992,461 B2 | 1/2006 | Liang et al. |
| D514,808 S | 2/2006 | Morine et al. |
| D516,309 S | 3/2006 | Richardson et al. |
| D516,553 S | 3/2006 | Richardson et al. |
| D516,554 S | 3/2006 | Richardson et al. |
| D516,807 S | 3/2006 | Richardson et al. |
| D517,007 S | 3/2006 | Yong-Jian et al. |
| D520,744 S | 5/2006 | Pangrec et al. |
| 7,050,841 B1 | 5/2006 | Onda |
| 7,069,063 B2 | 6/2006 | Halkosaari et al. |
| D525,582 S | 7/2006 | Chan |
| 7,072,699 B2 | 7/2006 | Eiden |
| 7,079,879 B1 | 7/2006 | Sylvester et al. |
| 7,081,736 B2 | 7/2006 | Seil et al. |
| D526,780 S | 8/2006 | Richardson et al. |
| D526,958 S | 8/2006 | Shimizu |
| D530,079 S | 10/2006 | Thomas et al. |
| D535,252 S | 1/2007 | Sandnes |
| 7,158,376 B2 | 1/2007 | Richardson et al. |
| 7,166,987 B2 | 1/2007 | Lee et al. |
| D537,063 S | 2/2007 | Kim et al. |
| 7,180,735 B2 | 2/2007 | Thomas et al. |
| 7,180,754 B2 | 2/2007 | Qin et al. |
| 7,194,291 B2 | 3/2007 | Peng |
| D540,539 S | 4/2007 | Gutierrez |
| 7,203,467 B2 | 4/2007 | Siddiqui |
| D542,286 S | 5/2007 | Taniyama et al. |

(56) References Cited

U.S. PATENT DOCUMENTS

| | | |
|---|---|---|
| D542,524 S | 5/2007 | Richardson et al. |
| D543,541 S | 5/2007 | Chung et al. |
| D544,486 S | 6/2007 | Hussaini et al. |
| 7,230,823 B2 | 6/2007 | Richardson et al. |
| D547,056 S | 7/2007 | Griffin et al. |
| D547,057 S | 7/2007 | Griffin et al. |
| D550,455 S | 9/2007 | Barnhart |
| D551,252 S | 9/2007 | Andre et al. |
| 7,266,391 B2 | 9/2007 | Warren |
| D551,856 S | 10/2007 | Ko et al. |
| D553,857 S | 10/2007 | Pendergraph et al. |
| D556,679 S | 12/2007 | Weinstein et al. |
| D556,681 S | 12/2007 | Kim |
| D557,205 S | 12/2007 | Kim |
| D557,264 S | 12/2007 | Richardson et al. |
| D557,494 S | 12/2007 | Mayette et al. |
| D557,897 S | 12/2007 | Richardson et al. |
| 7,312,984 B2 | 12/2007 | Richardson et al. |
| D558,667 S | 1/2008 | Park et al. |
| D558,757 S | 1/2008 | Andre et al. |
| D558,972 S | 1/2008 | Oh |
| D558,973 S | 1/2008 | Hussaini et al. |
| D559,267 S | 1/2008 | Griffin |
| D560,229 S | 1/2008 | Yagi |
| D561,092 S | 2/2008 | Kim |
| 7,336,973 B2 | 2/2008 | Goldthwaite et al. |
| D563,093 S | 3/2008 | Nussberger |
| 7,343,184 B2 | 3/2008 | Rostami |
| D565,291 S | 4/2008 | Brandenburg et al. |
| 7,397,658 B2 | 7/2008 | Finke-Anlauff et al. |
| 7,400,917 B2 * | 7/2008 | Wood ............... H04B 1/3888 455/575.1 |
| D574,326 S | 8/2008 | Lim |
| D574,819 S | 8/2008 | Andre et al. |
| D575,056 S | 8/2008 | Tan |
| 7,428,427 B2 | 9/2008 | Brunstrom et al. |
| D577,904 S | 10/2008 | Sasaki |
| D581,151 S | 11/2008 | Aipa |
| D581,155 S | 11/2008 | Richardson et al. |
| D581,421 S | 11/2008 | Richardson et al. |
| D582,149 S | 12/2008 | Tan |
| 7,464,814 B2 | 12/2008 | Carnevali |
| D584,732 S | 1/2009 | Cho et al. |
| 7,479,759 B2 | 1/2009 | Vilanov et al. |
| D587,008 S | 2/2009 | Richardson et al. |
| D587,896 S | 3/2009 | Aipa |
| D589,016 S | 3/2009 | Richardson et al. |
| 7,536,099 B2 | 5/2009 | Dalby et al. |
| D593,319 S | 6/2009 | Richardson et al. |
| D593,746 S | 6/2009 | Richardson et al. |
| D594,849 S | 6/2009 | Ko |
| 7,555,325 B2 | 6/2009 | Goros |
| D597,089 S | 7/2009 | Khan et al. |
| 7,562,813 B2 | 7/2009 | Humphrey et al. |
| D597,301 S | 8/2009 | Richardson et al. |
| D598,407 S | 8/2009 | Richardson et al. |
| 7,577,462 B2 | 8/2009 | Kumar |
| D600,640 S | 9/2009 | Stein et al. |
| D600,908 S | 9/2009 | Richardson et al. |
| D601,955 S | 10/2009 | Ekmekdje |
| D601,959 S | 10/2009 | Lee et al. |
| D601,960 S | 10/2009 | Dai |
| 7,609,512 B2 | 10/2009 | Richardson et al. |
| D603,602 S | 11/2009 | Richardson et al. |
| D603,603 S | 11/2009 | Laine et al. |
| 7,612,997 B1 | 11/2009 | Diebel et al. |
| D605,850 S | 12/2009 | Richardson et al. |
| D606,528 S | 12/2009 | Khan et al. |
| D606,529 S | 12/2009 | Ferrari et al. |
| 7,635,086 B2 | 12/2009 | Spencer, II |
| 7,638,969 B2 | 12/2009 | Woud |
| 7,647,082 B2 | 1/2010 | Holmberg |
| D609,228 S | 2/2010 | Ferrari et al. |
| D609,463 S | 2/2010 | Bullen |
| D610,538 S | 2/2010 | Wu et al. |
| 7,656,120 B2 | 2/2010 | Neu et al. |
| 7,663,878 B2 | 2/2010 | Swan et al. |
| 7,667,433 B1 | 2/2010 | Smith |
| D610,807 S | 3/2010 | Bau |
| D611,042 S | 3/2010 | Ferrari et al. |
| D611,478 S | 3/2010 | Richardson et al. |
| 7,669,829 B2 | 3/2010 | Ogatsu |
| D613,282 S | 4/2010 | Richardson et al. |
| D615,077 S | 5/2010 | Richardson et al. |
| D615,535 S | 5/2010 | Richardson et al. |
| D615,536 S | 5/2010 | Richardson et al. |
| D615,967 S | 5/2010 | Richardson et al. |
| D616,360 S | 5/2010 | Huang |
| D616,361 S | 5/2010 | Huang |
| D617,753 S | 6/2010 | Cheng |
| D617,784 S | 6/2010 | Richardson et al. |
| D617,785 S | 6/2010 | Richardson et al. |
| D617,786 S | 6/2010 | Richardson et al. |
| D617,787 S | 6/2010 | Richardson et al. |
| D618,231 S | 6/2010 | Fahrendorff et al. |
| 7,733,637 B1 | 6/2010 | Lam |
| D619,573 S | 7/2010 | Khan et al. |
| D619,574 S | 7/2010 | Richardson et al. |
| D619,991 S | 7/2010 | Huang |
| D620,000 S | 7/2010 | Bau |
| D620,487 S | 7/2010 | Richardson et al. |
| D621,394 S | 8/2010 | Richardson et al. |
| D621,395 S | 8/2010 | Richardson et al. |
| D621,821 S | 8/2010 | Richardson et al. |
| D621,822 S | 8/2010 | Richardson et al. |
| 7,778,023 B1 | 8/2010 | Mohoney |
| 7,782,610 B2 | 8/2010 | Diebel et al. |
| D623,179 S | 9/2010 | Richardson et al. |
| D623,180 S | 9/2010 | Diebel |
| D623,638 S | 9/2010 | Richardson et al. |
| D623,639 S | 9/2010 | Richardson et al. |
| D623,640 S | 9/2010 | Freeman |
| D624,317 S | 9/2010 | Wenchel et al. |
| D624,533 S | 9/2010 | Richardson et al. |
| D624,908 S | 10/2010 | Huskinson |
| D624,909 S | 10/2010 | Huskinson |
| D624,910 S | 10/2010 | Richardson et al. |
| D625,303 S | 10/2010 | Kim |
| D626,120 S | 10/2010 | Richardson et al. |
| D626,121 S | 10/2010 | Richardson et al. |
| D626,538 S | 11/2010 | Brown et al. |
| D626,539 S | 11/2010 | Brown et al. |
| D626,540 S | 11/2010 | Brown et al. |
| D626,964 S | 11/2010 | Richardson et al. |
| D628,568 S | 12/2010 | Richardson et al. |
| D628,994 S | 12/2010 | Griffin, Jr. et al. |
| 7,859,222 B2 | 12/2010 | Woud |
| D631,246 S | 1/2011 | Boettner |
| 7,863,856 B2 | 1/2011 | Sherman et al. |
| 7,863,862 B2 | 1/2011 | Idzik et al. |
| D631,877 S | 2/2011 | Rak et al. |
| D632,648 S | 2/2011 | Yang |
| D632,683 S | 2/2011 | Richardson et al. |
| D632,684 S | 2/2011 | Richardson et al. |
| D632,685 S | 2/2011 | Richardson et al. |
| D632,686 S | 2/2011 | Magness et al. |
| 7,889,489 B2 | 2/2011 | Richardson et al. |
| 7,889,498 B2 | 2/2011 | Diebel et al. |
| D634,704 S | 3/2011 | Tieleman et al. |
| D634,741 S | 3/2011 | Richardson et al. |
| 7,899,397 B2 | 3/2011 | Kumar |
| 7,907,394 B2 | 3/2011 | Richardson et al. |
| 7,911,530 B2 | 3/2011 | Sawachi |
| D636,386 S | 4/2011 | Richardson et al. |
| D636,387 S | 4/2011 | Willes et al. |
| 7,930,011 B2 | 4/2011 | Shi et al. |
| 7,933,122 B2 | 4/2011 | Richardson et al. |
| D637,588 S | 5/2011 | Richardson et al. |
| D637,589 S | 5/2011 | Willes et al. |
| D637,590 S | 5/2011 | Michie et al. |
| D637,591 S | 5/2011 | Willes et al. |
| D637,592 S | 5/2011 | Magness et al. |
| D637,952 S | 5/2011 | Tan |
| D638,005 S | 5/2011 | Richardson et al. |

(56) References Cited

U.S. PATENT DOCUMENTS

| | | | |
|---|---|---|---|
| D638,411 S | 5/2011 | Willes et al. |
| D638,413 S | 5/2011 | Magness et al. |
| D638,414 S | 5/2011 | Magness et al. |
| D638,828 S | 5/2011 | Melanson et al. |
| D638,829 S | 5/2011 | Melanson et al. |
| D638,830 S | 5/2011 | Magness et al. |
| D639,731 S | 6/2011 | Sun |
| D640,679 S | 6/2011 | Willes et al. |
| D640,680 S | 6/2011 | Magness et al. |
| 7,957,524 B2 | 6/2011 | Chipping |
| D641,013 S | 7/2011 | Richardson et al. |
| D641,014 S | 7/2011 | Smith et al. |
| D641,974 S | 7/2011 | Stampfli |
| D642,170 S | 7/2011 | Johnson et al. |
| D642,171 S | 7/2011 | Melanson et al. |
| D642,558 S | 8/2011 | Magness |
| D643,029 S | 8/2011 | Feng |
| D643,424 S | 8/2011 | Richardson et al. |
| D644,215 S | 8/2011 | Dong |
| D644,216 S | 8/2011 | Richardson et al. |
| D644,219 S | 8/2011 | Sawada |
| 7,988,010 B2 | 8/2011 | Yang et al. |
| 8,004,962 B2 | 8/2011 | Yang et al. |
| D644,635 S | 9/2011 | Richardson et al. |
| D644,639 S | 9/2011 | Weller et al. |
| D647,084 S | 10/2011 | Fathollahi |
| D647,108 S | 10/2011 | Lee |
| 8,028,794 B1 | 10/2011 | Freeman |
| 8,046,039 B2 | 10/2011 | Lee et al. |
| D648,714 S | 11/2011 | Jones, III et al. |
| D648,715 S | 11/2011 | Jones, III et al. |
| D648,716 S | 11/2011 | Jones, III et al. |
| D648,717 S | 11/2011 | Fahrendorff et al. |
| D649,143 S | 11/2011 | Jones, III et al. |
| D649,539 S | 11/2011 | Hong |
| D650,810 S | 12/2011 | Lemelman et al. |
| D652,827 S | 1/2012 | Fahrendorff et al. |
| D652,828 S | 1/2012 | Fahrendorff et al. |
| D653,202 S | 1/2012 | Hasbrook et al. |
| D653,659 S | 2/2012 | Fahrendorff et al. |
| D654,069 S | 2/2012 | Kwon |
| D654,483 S | 2/2012 | Richardson et al. |
| D654,931 S | 2/2012 | Lemelman et al. |
| D655,281 S | 3/2012 | Turocy |
| D655,699 S | 3/2012 | Bau |
| D656,495 S | 3/2012 | Andre et al. |
| D658,165 S | 4/2012 | Freeman |
| 8,150,485 B2 | 4/2012 | Lee |
| D658,643 S | 5/2012 | Fahrendorff et al. |
| 8,167,127 B2 | 5/2012 | Martin et al. |
| D662,923 S | 7/2012 | Piedra et al. |
| D663,263 S | 7/2012 | Gupta et al. |
| D663,319 S | 7/2012 | Chen et al. |
| D664,091 S | 7/2012 | Pliner et al. |
| 8,224,408 B2 | 7/2012 | Tomasini et al. |
| D665,386 S | 8/2012 | Fathollahi |
| D665,735 S | 8/2012 | Kang et al. |
| 8,245,842 B2 | 8/2012 | Bau |
| 8,247,102 B2 | 8/2012 | Hua |
| D667,783 S | 9/2012 | Zhang et al. |
| D670,281 S | 11/2012 | Corpuz et al. |
| D670,689 S | 11/2012 | Wang |
| D671,105 S | 11/2012 | Rothbaum et al. |
| D671,106 S | 11/2012 | Rothbaum et al. |
| D671,493 S | 11/2012 | Hasbrook et al. |
| 8,321,619 B2 | 11/2012 | Kular et al. |
| 8,328,008 B2 | 12/2012 | Diebel et al. |
| D674,394 S | 1/2013 | Kajimoto |
| 8,342,325 B2 | 1/2013 | Rayner |
| D675,603 S | 2/2013 | Melanson et al. |
| D676,032 S | 2/2013 | Stump et al. |
| D676,432 S | 2/2013 | Hasbrook et al. |
| 8,367,235 B2 * | 2/2013 | Huang ............... H01M 2/1022 361/679.56 |
| 8,380,264 B2 | 2/2013 | Hung et al. |
| D677,249 S | 3/2013 | Li et al. |
| D678,869 S | 3/2013 | Diebel |
| 8,390,255 B1 | 3/2013 | Fathollahi |
| 8,393,466 B2 | 3/2013 | Rayner |
| D679,271 S | 4/2013 | Liu |
| D679,684 S | 4/2013 | Baker et al. |
| D681,020 S | 4/2013 | Magness et al. |
| D682,196 S | 5/2013 | Leung |
| D682,815 S | 5/2013 | Chang |
| D683,338 S | 5/2013 | Wilson et al. |
| 8,439,191 B1 | 5/2013 | Lu |
| 8,452,242 B2 | 5/2013 | Spencer, II |
| 8,457,701 B2 | 6/2013 | Diebel |
| D685,356 S | 7/2013 | Diebel |
| D686,152 S | 7/2013 | Lee et al. |
| D686,606 S | 7/2013 | Hong |
| 8,483,758 B2 | 7/2013 | Huang |
| D687,426 S | 8/2013 | Requa |
| D688,233 S | 8/2013 | Dong |
| 8,499,933 B2 | 8/2013 | Ziemba |
| 8,505,718 B2 | 8/2013 | Griffin, Jr. et al. |
| 8,509,864 B1 | 8/2013 | Diebel |
| 8,509,865 B1 | 8/2013 | LaColla et al. |
| 8,531,833 B2 | 9/2013 | Diebel et al. |
| D691,990 S | 10/2013 | Rayner |
| 8,560,014 B1 | 10/2013 | Hu et al. |
| D693,801 S | 11/2013 | Rayner |
| 8,579,172 B2 | 11/2013 | Monaco et al. |
| D696,234 S | 12/2013 | Wright |
| D697,502 S | 1/2014 | Chu et al. |
| D698,774 S | 2/2014 | Wardy |
| D703,652 S | 4/2014 | Melanson et al. |
| D704,182 S | 5/2014 | Smith |
| D704,688 S | 5/2014 | Reivo et al. |
| D706,255 S | 6/2014 | Akana et al. |
| D706,256 S | 6/2014 | Ward et al. |
| D706,272 S | 6/2014 | Poon |
| D709,058 S | 7/2014 | Hemesath et al. |
| D710,344 S | 8/2014 | Smith et al. |
| D710,795 S | 8/2014 | Gupta et al. |
| D710,839 S | 8/2014 | Chang |
| D711,312 S | 8/2014 | Tien |
| D711,362 S | 8/2014 | Poon |
| D711,863 S | 8/2014 | Wen |
| D714,278 S | 9/2014 | Case et al. |
| D716,784 S | 11/2014 | Wen |
| D716,785 S | 11/2014 | White |
| 8,917,506 B2 | 12/2014 | Diebel et al. |
| D721,356 S | 1/2015 | Hasbrook et al. |
| D721,685 S | 1/2015 | Hasbrook et al. |
| D721,687 S | 1/2015 | To et al. |
| 8,954,117 B2 | 2/2015 | Huang |
| D723,530 S | 3/2015 | Namminga et al. |
| 8,971,039 B2 * | 3/2015 | Huang ............... H01M 2/1022 361/679.41 |
| D727,883 S | 4/2015 | Brand et al. |
| 9,026,187 B2 | 5/2015 | Huang |
| D732,012 S | 6/2015 | Tsai et al. |
| 9,077,013 B2 | 7/2015 | Huang et al. |
| 9,088,028 B2 | 7/2015 | Huang et al. |
| 9,088,029 B2 * | 7/2015 | Huang ............... H01M 2/1022 |
| 9,123,935 B2 | 9/2015 | Huang |
| D744,472 S | 12/2015 | Lerenthal |
| D744,993 S | 12/2015 | Diebel |
| D744,995 S | 12/2015 | Lerenthal |
| 2001/0054148 A1 | 12/2001 | Hoornaert et al. |
| 2002/0065054 A1 | 5/2002 | Humphreys et al. |
| 2002/0111189 A1 | 8/2002 | Chou |
| 2002/0147035 A1 | 10/2002 | Su |
| 2002/0193136 A1 | 12/2002 | Halkosaari et al. |
| 2002/0197965 A1 | 12/2002 | Peng |
| 2003/0000984 A1 | 1/2003 | Vick, III |
| 2003/0096642 A1 | 5/2003 | Bessa et al. |
| 2003/0151890 A1 | 8/2003 | Huang et al. |
| 2003/0217210 A1 | 11/2003 | Carau, Sr. |
| 2003/0218445 A1 | 11/2003 | Behar |
| 2003/0228866 A1 | 12/2003 | Pezeshki |
| 2004/0096054 A1 | 5/2004 | Nuovo |
| 2004/0097256 A1 | 5/2004 | Kujawski |

(56) References Cited

U.S. PATENT DOCUMENTS

| | | |
|---|---|---|
| 2004/0104268 A1 | 6/2004 | Bailey |
| 2004/0247113 A1 | 12/2004 | Akatsu |
| 2004/0268005 A1* | 12/2004 | Dickie .................. G06F 1/1616 710/303 |
| 2005/0049016 A1 | 3/2005 | Cho et al. |
| 2005/0088141 A1 | 4/2005 | Lee et al. |
| 2005/0090301 A1 | 4/2005 | Lange et al. |
| 2005/0093510 A1 | 5/2005 | Seil et al. |
| 2005/0116684 A1 | 6/2005 | Kim |
| 2005/0130721 A1 | 6/2005 | Gartrell |
| 2005/0231159 A1 | 10/2005 | Jones et al. |
| 2005/0247787 A1 | 11/2005 | Von Mueller et al. |
| 2005/0248312 A1 | 11/2005 | Cao et al. |
| 2005/0286212 A1 | 12/2005 | Brignone et al. |
| 2006/0010588 A1 | 1/2006 | Schuster et al. |
| 2006/0052064 A1 | 3/2006 | Goradesky |
| 2006/0058073 A1 | 3/2006 | Kim |
| 2006/0063569 A1 | 3/2006 | Jacobs et al. |
| 2006/0099999 A1 | 5/2006 | Park |
| 2006/0105722 A1* | 5/2006 | Kumar .................. G06F 1/1632 455/90.3 |
| 2006/0105824 A1 | 5/2006 | Kim et al. |
| 2006/0125445 A1 | 6/2006 | Cao et al. |
| 2006/0140461 A1 | 6/2006 | Kim |
| 2006/0197674 A1 | 9/2006 | Nakajima |
| 2006/0205447 A1 | 9/2006 | Park et al. |
| 2006/0255493 A1 | 11/2006 | Fouladpour |
| 2007/0004450 A1 | 1/2007 | Parikh |
| 2007/0019804 A1 | 1/2007 | Kramer |
| 2007/0093140 A1 | 4/2007 | Begic et al. |
| 2007/0123316 A1 | 5/2007 | Little |
| 2007/0142097 A1 | 6/2007 | Hamasaki et al. |
| 2007/0152633 A1 | 7/2007 | Lee |
| 2007/0161404 A1 | 7/2007 | Yasujima et al. |
| 2007/0167190 A1 | 7/2007 | Moosavi et al. |
| 2007/0187563 A1 | 8/2007 | Ogatsu |
| 2007/0225031 A1 | 9/2007 | Bodkin et al. |
| 2007/0236180 A1 | 10/2007 | Rodgers |
| 2007/0261978 A1 | 11/2007 | Sanderson |
| 2007/0297149 A1 | 12/2007 | Richardson et al. |
| 2008/0007214 A1 | 1/2008 | Cheng |
| 2008/0026794 A1 | 1/2008 | Warren |
| 2008/0026803 A1 | 1/2008 | Demuynck |
| 2008/0032758 A1 | 2/2008 | Rostami |
| 2008/0053770 A1 | 3/2008 | Tynyk |
| 2008/0058010 A1 | 3/2008 | Lee |
| 2008/0096620 A1 | 4/2008 | Lee et al. |
| 2008/0108395 A1 | 5/2008 | Lee et al. |
| 2008/0119244 A1 | 5/2008 | Malhotra |
| 2008/0123287 A1* | 5/2008 | Rossell .................. G06F 1/1632 361/679.3 |
| 2008/0132289 A1 | 6/2008 | Wood et al. |
| 2008/0139258 A1 | 6/2008 | Park et al. |
| 2008/0150367 A1 | 6/2008 | Oh et al. |
| 2009/0009945 A1 | 1/2009 | Johnson et al. |
| 2009/0017883 A1 | 1/2009 | Lin |
| 2009/0051319 A1 | 2/2009 | Fang et al. |
| 2009/0069050 A1 | 3/2009 | Jain et al. |
| 2009/0073650 A1 | 3/2009 | Huang et al. |
| 2009/0096417 A1 | 4/2009 | Idzik et al. |
| 2009/0108800 A1 | 4/2009 | Woud |
| 2009/0111543 A1 | 4/2009 | Tai et al. |
| 2009/0114556 A1 | 5/2009 | Tai et al. |
| 2009/0117955 A1 | 5/2009 | Lo |
| 2009/0128092 A1 | 5/2009 | Woud |
| 2009/0143104 A1 | 6/2009 | Loh et al. |
| 2009/0144456 A1 | 6/2009 | Gelf et al. |
| 2009/0146898 A1 | 6/2009 | Akiho et al. |
| 2009/0152089 A1 | 6/2009 | Hanes |
| 2009/0160399 A1 | 6/2009 | Woud |
| 2009/0160400 A1 | 6/2009 | Woud |
| 2009/0181729 A1 | 7/2009 | Griffin, Jr. et al. |
| 2009/0205983 A1 | 8/2009 | Estlander |
| 2009/0247244 A1 | 10/2009 | Mittleman et al. |
| 2009/0284216 A1 | 11/2009 | Bessa et al. |
| 2009/0301289 A1 | 12/2009 | Gynes |
| 2009/0312058 A9 | 12/2009 | Wood et al. |
| 2009/0314400 A1 | 12/2009 | Liu |
| 2009/0325657 A1 | 12/2009 | Ramsdell et al. |
| 2010/0013431 A1 | 1/2010 | Liu |
| 2010/0022277 A1 | 1/2010 | An et al. |
| 2010/0026589 A1 | 2/2010 | Dou et al. |
| 2010/0048267 A1 | 2/2010 | Lin |
| 2010/0056054 A1 | 3/2010 | Yamato et al. |
| 2010/0064883 A1 | 3/2010 | Gynes |
| 2010/0078343 A1 | 4/2010 | Hoellwarth et al. |
| 2010/0088439 A1 | 4/2010 | Ang et al. |
| 2010/0093412 A1 | 4/2010 | Serra et al. |
| 2010/0096284 A1 | 4/2010 | Bau |
| 2010/0113106 A1* | 5/2010 | Supran .................. G06F 1/1632 455/573 |
| 2010/0132724 A1 | 6/2010 | Seidel et al. |
| 2010/0154062 A1 | 6/2010 | Baram et al. |
| 2010/0195279 A1 | 8/2010 | Michael |
| 2010/0200456 A1 | 8/2010 | Parkinson |
| 2010/0203931 A1 | 8/2010 | Hynecek et al. |
| 2010/0224519 A1 | 9/2010 | Kao |
| 2010/0243516 A1 | 9/2010 | Martin et al. |
| 2010/0302716 A1 | 12/2010 | Gandhi |
| 2010/0328203 A1 | 12/2010 | Hsu |
| 2011/0021255 A1 | 1/2011 | Kim et al. |
| 2011/0034221 A1 | 2/2011 | Hung et al. |
| 2011/0049005 A1 | 3/2011 | Wilson et al. |
| 2011/0055447 A1 | 3/2011 | Costa |
| 2011/0084081 A1 | 4/2011 | Chung et al. |
| 2011/0090626 A1 | 4/2011 | Hoellwarth et al. |
| 2011/0117974 A1 | 5/2011 | Spitalnik et al. |
| 2011/0136555 A1 | 6/2011 | Ramies et al. |
| 2011/0199041 A1 | 8/2011 | Yang |
| 2011/0253569 A1 | 10/2011 | Lord |
| 2011/0259664 A1 | 10/2011 | Freeman |
| 2011/0261511 A1 | 10/2011 | Alderson et al. |
| 2011/0297578 A1 | 12/2011 | Stiehl et al. |
| 2011/0309728 A1 | 12/2011 | Diebel |
| 2012/0013295 A1 | 1/2012 | Yeh |
| 2012/0071214 A1 | 3/2012 | Ash, Jr. et al. |
| 2012/0088555 A1 | 4/2012 | Hu |
| 2012/0088558 A1 | 4/2012 | Song |
| 2012/0115551 A1 | 5/2012 | Cho et al. |
| 2012/0122520 A1 | 5/2012 | Phillips |
| 2012/0161696 A1 | 6/2012 | Cook et al. |
| 2012/0177967 A1 | 7/2012 | Wang |
| 2012/0209745 A1 | 8/2012 | Spencer, II |
| 2012/0282977 A1 | 11/2012 | Haleluk |
| 2012/0320501 A1 | 12/2012 | Ackloo |
| 2012/0325637 A1 | 12/2012 | Kikuchi |
| 2013/0045775 A1 | 2/2013 | Heywood |
| 2013/0084799 A1 | 4/2013 | Marholev et al. |
| 2013/0098790 A1 | 4/2013 | Hong |
| 2013/0125251 A1 | 5/2013 | Johnson |
| 2013/0189923 A1 | 7/2013 | Lewin |
| 2013/0210475 A1 | 8/2013 | Nylund |
| 2013/0248339 A1 | 9/2013 | Koepsell |
| 2013/0273983 A1 | 10/2013 | Hsu |
| 2013/0307818 A1 | 11/2013 | Pope et al. |
| 2013/0314880 A1 | 11/2013 | Sun et al. |
| 2014/0069825 A1 | 3/2014 | Macrina et al. |
| 2014/0165379 A1 | 6/2014 | Diebel et al. |
| 2014/0239916 A1 | 8/2014 | To et al. |
| 2015/0072744 A1 | 3/2015 | Huang |
| 2015/0084593 A1 | 3/2015 | Huang et al. |
| 2015/0140386 A1 | 5/2015 | Huang et al. |
| 2015/0148093 A1 | 5/2015 | Huang et al. |
| 2015/0214993 A1 | 7/2015 | Huang |

FOREIGN PATENT DOCUMENTS

| | | |
|---|---|---|
| CN | 202535667 U | 11/2012 |
| CN | 302510329 S | 7/2013 |
| CN | 302573150 S | 9/2013 |
| EP | 1732291 A1 | 12/2006 |
| JP | 8-18637 | 1/1996 |
| JP | 2000-175720 | 6/2000 |
| KR | 10-2005-0027961 | 3/2005 |

(56) References Cited

FOREIGN PATENT DOCUMENTS

| | | |
|---|---|---|
| KR | 10-2008-0017688 | 2/2008 |
| KR | 20-2010-0005030 | 5/2010 |
| KR | 10-2010-0132724 | 12/2010 |
| KR | 10-2011-0005507 | 1/2011 |
| KR | 30-0650361 | 7/2012 |
| TW | D150044 | 11/2012 |
| TW | D156538 | 10/2013 |
| WO | WO 95/15619 | 6/1995 |
| WO | WO 97/33497 | 9/1997 |
| WO | WO 03/065227 A1 | 8/2003 |
| WO | WO 2008/151362 A2 | 12/2008 |

OTHER PUBLICATIONS

International Preliminary Report on Patentability for PCT/US2014/023592, dated Sep. 15, 2015.
Reexamination Control No. 90/013,319 including its prosecution history, Sep. 18, 2014 Filing Date, Huang et al.
U.S. Appl. No. 14/800,530 Including its prosecution history, filed Jul. 15, 2015, Huang.
U.S. Appl. No. 14/187,046 Including its prosecution history, filed Feb. 21, 2014, To et al.
U.S. Appl. No. 14/205,024 Including its prosecution history, filed Mar. 11, 2014, Huang et al.
U.S. Appl. No. 14/205,167 Including its prosecution history, filed Mar. 11, 2014, Huang et al.
U.S. Appl. No. 29/382,515 Including its prosecution history, filed Jan. 4, 2011, Gallouzi et al.
U.S. Appl. No. 29/406,346 Including its prosecution history, filed Nov. 11, 2011, Brand.
U.S. Appl. No. 29/464,620 Including its prosecution history, filed Aug. 19, 2013, Tsai.
U.S. Appl. No. 29/438,697 Including its prosecution history, filed Nov. 30, 2012, Namminga et al.
U.S. Appl. No. 29/435,907 Including its prosecution history, filed Oct. 30, 2012, To et al.
U.S. Appl. No. 29/438,877 Including its prosecution history, filed Dec. 4, 2012, To et al.
U.S. Appl. No. 29/440,062 Including its prosecution history, filed Dec. 18, 2012, To et al.
U.S. Appl. No. 29/478,391 Including its prosecution history, filed Jan. 3, 2014, Namminga et al.
U.S. Appl. No. 29/478,390 Including its prosecution history, filed Jan. 3, 2014, Dang et al.
U.S. Appl. No. 29/478,383 Including its prosecution history, filed Jan. 3, 2014, Dang et al.
U.S. Appl. No. 29/478,388 Including its prosecution history, filed Jan. 3, 2014, Kim et al.
U.S. Appl. No. 14/675,067 Including its prosecution history, filed Mar. 31, 2015, To et al.
U.S. Appl. No. 29/499,868 Including its prosecution history, filed Aug. 19, 2014, Mophie, Inc.
U.S. Appl. No. 29/510,154 Including its prosecution history, filed Nov. 25, 2014, Mophie, Inc.
U.S. Appl. No. 29/510,153 Including its prosecution history, filed Nov. 25, 2014, Mophie, Inc.
U.S. Appl. No. 29/522,987 Including its prosecution history, filed Apr. 6, 2015, Gjøvik et al.
U.S. Appl. No. 29/510,839 Including its prosecution history, filed Dec. 3, 2014, Mophie, Inc.
U.S. Appl. No. 29/523,211 Including its prosecution history, filed Apr. 7, 2015, To et al.
U.S. Appl. No. 29/523,209 Including its prosecution history, filed Apr. 7, 2015, Mophie, Inc.
U.S. Appl. No. 29/528,266 Including its prosecution history, filed May 27, 2015, Gjøvik et al.
International Search Report and Written Opinion of the International Searching Authority for PCT/US2011/037244, dated Jul. 19, 2011.
International Preliminary Report on Patentability for PCT/US2011/037244, dated Nov. 29, 2012.
International Search Report and Written Opinion of the International Searching Authority for PCT/US2011/037249, dated Jul. 13, 2011.
International Preliminary Report on Patentability for PCT/US2011/037249, dated Nov. 29, 2012.
International Search Report and Written Opinion of the International Searching Authority for PCT/US2011/037254, dated Jul. 13, 2011.
International Preliminary Report on Patentability for PCT/US2011/037254, dated Nov. 29, 2012.
International Search Report and Written Opinion of the International Searching Authority for PCT/US2011/037257, dated Sep. 22, 2011.
International Preliminary Report on Patentability for PCT/US2011/037257, dated Nov. 29, 2012.
International Search Report and Written Opinion of the International Searching Authority for PCT/US2012/041768, dated Feb. 27, 2013.
International Preliminary Report on Patentability for PCT/US2012/041768, dated Dec. 27, 2013.
International Search Report and Written Opinion of the International Searching Authority for PCT/US2013/057276, dated Dec. 10, 2013.
International Preliminary Report on Patentability for PCT/US2013/057276, dated Mar. 3, 2015.
International Search Report and Written Opinion of the International Searching Authority for PCT/US2014/017781, dated Jun. 8, 2014.
International Search Report and Written Opinion of the International Searching Authority for PCT/US2014/023592, dated Aug. 28, 2014.
International Search Report and Written Opinion for PCT/US2014/067470, dated Mar. 31, 2015.
Mophie Pulse for iPod Touch 4G, http://www.mophie.com/pulse-iPod-Touch-4th-Gen-vibrating-gaming-case-p/2015_PUL-T4-GRY.htm.
"Sandberg BatteryCase for iPhone 4/4S delivers more band for your buck," dated Mar. 15, 2012, http://www.gizmag.com/sanberg-batterycase-iphone/21839.
Shawn Brown, "Incase Power Slider battery doubles as a case," dated Nov. 19, 2008, http://www.iphonebuzz.com/incase-power-slider-battery-doubles-as-a-case-195224.php.
Nick Guy, "Incipio offGRID Battery Case for iPhone 5/5s," dated Oct. 9, 2013, http://www.ilounge.corn/index.php/reviews/entry/incipio-offgrid-battery-case-for-iphone-5-5s/.
Jeremy Horwitz, "Mophie Juice Pack Plus for iPhone 5," dated May 21, 2013, http://www.ilounge.com/index.php/reviews/entry/mophie-juice-pack-plus-for-iphone-5/.
Nick Guy, "RND Power Solutions Sync & Charge Dock with Lightning Connector," dated Nov. 18, 2013, http://www.ilounge.com/index.php/reviews/entry/tylt-energi-sl.
Jeremy Horwitz, "Kensington Mini Battery Pack and Charger for iPhone and iPod," dated May 16, 2008, http://www.ilounge.com/index.php/reviews/entry/kensington-mini-battery-pack-and-charger-for-iphone-and-ipod/.
Kensington Mini Battery Pack and Charger for iPhone and iPod, dated Sep. 30, 2008, 1 Page.
Sven Rafferty, "Mybat External Battery for iPhone and iPod," dated May 18, 2008, http://svenontech.com/reviews/?p=74.
Dave Rees, "Richard Solo Backup Battery for iPhone / iPod Review," dated Jun. 16, 2008, http://the-gadgeteer.com/2008/06/16/richard_solo_backup_battery_for_iphone_ipod/.
Devin Coldewey, "Combination iPhone battery pack and flash from FastMac," dated Nov. 4, 2008, http://crunchgear.com/2008/11/04/combination-iphone-battery-pack-and-flash-from-fastmac/.
"Cheap DIY iPhone External Battery," dated Jul. 22, 2008, http://fastdad.wordpress.com/2008/07/22/cheap-diy-iphone-external-battery/.
Jeremy Horwitz, "iLuv i603 / i604 Rechargeable Lithium Polymer Batteries with Silicone Skin," dated Jun. 27, 2006, http://www.ilounge.com/index.php/reviews/entry/iluv-i603-rechargeable-lithium-polymer-battery-with-silicone-skin/.
Julie Strietelmeier, "Seidio INNODock Desktop Cradle for Treo 650," dated Jul. 28, 2005, http://the-gadgeteer.com/2005/07/28/seidio_innodock_desktop_cradle_for_treo_650/.
Brian Nyhuis, "Mophie Juice Pack Battery Case for Samsung Galaxy S III Review," dated Nov. 28, 2012, http://www.legitreviews.com/mophie-juice-pack-battery-case-for-samsung-galaxy-s-iii-review_2084.

(56) References Cited

OTHER PUBLICATIONS

"PowerSkin Samsung Galaxy S3 Case with Backup Battery," dated Aug. 19, 2012, http://gadgetsin.com/powerskin-samsung-galaxy-s3-case-with-backup-battery.htm.
"iPhone 4 Case with Battery Pack," dated Sep. 28, 2010, http://gadgetsin.com/iphone-4-case-with-battery-pack.htm.
Jonathan Pena, "iPhone 5 Cases, Round 3," dated Sep. 16, 2012, http://www.technologytell.com/apple/103833/iphone-5-cases-round-3/.
Jeremy Horwitz, "Mophie Juice Pack for iPhone," dated Dec. 7, 2007, http://www.ilounge.com/index.php/reviews/entry/mophie-juice-pack-for-iphone/.
Dr. Macenstein, "Review: Mophie Juice Pack for iPhone," dated Apr. 27, 2008, http://macenstein.com/default/archives/1314.
Wayne Schulz, "iPhone Extended Battery Review—Mophie Juice Pack," dated Jun. 17, 2008, http://www.geardiary.com/2008/06/17/iphone-extended-battery-review-mophie-juice-pack/.
Mophie Juice Pack iPhone 1G Product—Figures 1-7—Retrieved from http://www.mophie.com/products/juice-pack on Apr. 10, 2009.
Mophie Juice Pack iPhone 1G Product—Figure 8—Retrieved from http://www.mophie.com/pages/information/ on Apr. 10, 2009.
Mophie Juice Pack iPhone 1G Product—Figures 9-14—Retrieved from http://www.mophie.com/blogs/Juice_Pack_FAQ on Apr. 10, 2009.
Mophie Juice Pack iPhone 1G Product—Figures 15-16—Retrieved from http://mophie.com/blogs/Juice_Pack_FAQ on Apr. 20, 2009. Figure 16 is dated May 1, 2008.
Tomas Ratas, "Mophie Juice Pack—iPhone 3G," dated Dec. 9, 2008, http://www.testfreaks.com/blog/review/mophie-juice-pack-iphone-3g/.
Dr. Macenstein, "Review: Mophie Juice Pack 3G for iPhone," dated Nov. 27, 2008, http://macenstein.com/default/archives/1820.
Ewdison Then, "Mophie Juice Pack iPhone 3G Review," dated Nov. 12, 2008, http://www.slashgear.com/mophie-juice-pack-iphone-3g-review-1222446/.
Mophie Juice Pack iPhone 3G Product—Figures 1-8—Retrieved from http://www.mophie.com/products/juice-pack-iphone-3g on Apr. 10, 2009.
Mophie Juice Pack iPhone 3G Product—Figures 9-10—Retrieved from http://www.mophie.com/pages/iphone-3g-details on Apr. 10, 2009.
Mophie Juice Pack iPhone 3G Product—Figures 11-14—Retrieved from http://mophie.com/blogs/Juice_Pack_3G_FAQ on Apr. 10, 2009.
Mophie Juice Pack iPhone 3G Product—Figures 15-16—Retrieved from http://mophie.com/blogs/press on Apr. 20, 2009. Figure 15 is dated Aug. 4, 2008, and Figure 16 is dated Nov. 10, 2008.
Mophie Juice Pack iPhone 3G User Manual—Retrieved from http://static3.shopify.com/s/files/1/0008/4942/assets/mophie_juice_pack_3G_manual_rl.pdf on Apr. 10, 2009.
Panasonic Lithium Ion Batteries Technical Handbook, dated 2007.
Chris Foresman, "Several Backup Batteries Can Extend Your Daily iPhone 3G Use," dated Jul. 18, 2008, http://arstechnica.com/apple/2008/07/several-backup-batteries-can-extend-your-daily-iphone-3g-use/.
Using Your Treo 650 Smartphone by palmOne, dated 2005.
Lisa Gade, "Palm Treo 750," dated Jan. 17, 2007, http://www.mobiletechreview.com/phones/Treo-750.htm.
Incase Power Slider 3G for iPhone 3G Product Reference, alleged by Incase to be available on Nov. 28, 2008.
iPhone User's Guide, 2007.
"Power Slider," Web Archive Date Dec. 4, 2008, https://web.archive.org/web/20081204105303/http://goincase.com/products/detail/power-slider-ec20003/?
Azadeh Ensha, "A Case for Filling the iPhone 3G's Power Vacuum," Dated Nov. 27, 2008.
Joseph Flatley, "Incase Power Slider for iPhone 3G Doubles the Juice, Lets You Sync," dated Nov. 17, 2008.

Darren Quick, "Mophie Juice Pack for iPhone 3G now shipping," dated Nov. 10, 2008, http://www.gizmag.com/mophie-juice-pack-iphone-3g/10342/.
Otterbox Catalog, 2006.
Jeremy Horowitz, "PhoneSuit MiLi Power Pack for iPhone," Jan. 29, 2009, http://www.ilounge.com/index.php/reviews/entry/phonesuit-mili-power-pack-for-iphone/.
Jeremy Horowitz, "FastMac TruePower iV Universal Battery Charger," Dec. 11, 2008, http://www.ilounge.com/index.php/reviews/entry/fastmac-truepower-iv-universal-battery-charger/.
Jeremy Horowitz, "Konnet PowerKZ Extended Power for iPhone," Apr. 2, 2009, http://www.ilounge.com/index.php/reviews/entry/konnet-powerkz-extended-power-for-iphone/.
"Test: Batterie iPhone SKPAD" with Machine English Translation, Feb. 2, 2009, http://iphonesofa.com/2009/02/02/test-batterie-iphone-skpad.
Kanamori et al., "USB battery-charger designs meet new industry standards," EDN pp. 63-70, dated Feb. 21, 2008.
AVR458: Charging Lithium-Ion Batteries with ATAVRBC100, which appear to include a date of Aug. 2008.
Battery Charging Specification, dated Apr. 15, 2009.
BCM2033 Product Brief, 2 pages, dated Nov. 1, 2002.
"USB battery charger detector intelligently powers mobiles," Dec. 17, 2007, http://www.eetasia.com/ART_8800493819_765245_NP_10b171b6.HTMce#.
Webpage Archive, Mophie.com, Nov. 25, 2007.
Ben Kaufman, "Behind the Invention: The mophie Juice Pack," dated Dec. 31, 2013, https://medium.com/@benkaufman/behind-the-invention-the-mophie-juice-pack-a0620f74efcf.
Mophie Relo Recharge, dated Feb. 7, 2006, http://songsling.com/recharge.html.
*Case-Ari, LLC* v. *mStation, Inc.*, Case No. 1:2010-CV-01874 in the United States District Court for the Northern District of Georgia, filed Jun. 17, 2010.
*Daniel Huang* v. *GC Technology, LLC*, Case No. CV10-4705 Cas (VBKx) in the United States District Court for the Central District of California, filed Jun. 24, 2010.
*Hali-Power, Inc.* v. *mStation Corp.*, Case No. 1:2010-CV-00773 in the United States District Court for the Northern District of New York, filed Jun. 30, 2010.
*Mophie, Inc.* v. *Loza & Loza, LLP*, Case No. SACV11-00539 Doc (MLGx) in the United States District Court for the Central District of California, filed Apr. 7, 2011.
Mophie's Complaint, filed Apr. 7, 2011 in *Mophie, Inc.* v. *Loza & Loza, LLP*, Case No. SACV11-00539 DOC (MLGx) in the United States District Court for the Central District of California.
*Mophie, Inc.* v. *Foreign Trade Corporation*, Case No. 8:12-CV-00292-JST-RNB in the United States District Court for the Central District of California, filed Feb. 24, 2012.
*Mophie, Inc.* v. *Kdlinks Inc.*, Case No. 2:2012-CV-02639 in the United States District Court for the Central District of California, filed Mar. 27, 2012.
*Otter Products, LLC* v. *Mophie, LLC*, Case No. 1:2012-CV-01969 in the United States District Court for the District of Colorado, filed Jul. 27, 2012.
Mophie's Answer, filed Oct. 15, 2012 in *Otter Products, LLC* v. *Mophie, LLC*, Case No. 1:2012-CV-01969 in the United States District Court for the District of Colorado.
Otter's Motion for Summary Judgment of Infringement and Declaration in Support Thereof, filed May 13, 2013 in *Otter Products, LLC* v. *Mophie, LLC*, Case No. 1:2012-CV-01969 in the United States District Court for the District of Colorado.
Mophie's Opposition to Motion for Summary Judgment of Infringement, filed Jun. 6, 2013 in *Otter Products, LLC* v. *Mophie, LLC*, Case No. 1:2012-CV-01969 in the United States District Court for the District of Colorado.
Mophie's Claim Construction Brief, filed Jun. 14, 2013 in *Otter Products, LLC* v. *Mophie, LLC*, Case No. 1:2012-CV-01969 in the United States District Court for the District of Colorado.
Otter's Claim Construction Brief, filed Jun. 14, 2013 in *Otter Products, LLC* v. *Mophie, LLC*, Case No. 1:2012-CV-01969 in the United States District Court for the District of Colorado.

(56) References Cited

OTHER PUBLICATIONS

Mophie's Brief in Response to Otter's Claim Construction Brief, filed Jun. 24, 2013 in *Otter Products, LLC v. Mophie, LLC*, Case No. 1:2012-CV-01969 in the United States District Court for the District of Colorado.
Otter's Rebuttal Brief for Construction of Claim Terms and Declaration, filed Jun. 24, 2013 in *Otter Products, LLC v. Mophie, LLC*, Case No. 1:2012-CV-01969 in the United States District Court for the District of Colorado.
Otter's Reply in Support of Motion for Summary Judgment of Infringement, filed Jun. 24, 2013 in *Otter Products, LLC v. Mophie, LLC*, Case No. 1:2012-CV-01969 in the United States District Court for the District of Colorado.
Joint Claim Construction Statement, filed Jun. 26, 2013 in *Otter Products, LLC v. Mophie, LLC*, Case No. 1:2012-CV-01969 in the United States District Court for the District of Colorado.
*Incase Designs, Inc. v. Mophie, Inc.*, Case No. 3:2013-CV-00602 in the United States District Court for the Northern District of California, filed Feb. 12, 2013.
Mophie's Amended Answer and Counterclaims, filed May 8, 2013 in *Incase Designs, Inc. v. Mophie, Inc.*, Case No. 3:2013-CV-00602 in the United States District Court for the Northern District of California.
Mophie's Opposition to Motion to Strike Amended Affirmative Defenses, Filed Jun. 12, 2013 in *Incase Designs, Inc. v. Mophie, Inc.*, Case No. 3:2013-CV-00602 in the United States District Court for the Northern District of California.
Mophie's Reply in Support of Motion to Stay and Supporting Declaration, filed Sep. 3, 2103 in *Incase Designs, Inc. v. Mophie, Inc.*, Case No. 3:2013-CV-00602 in the United States District Court for the Northern District of California.
*Incase Designs, Inc. v. Mophie, Inc.*, Case No. 3:2013-CV-03356 in the United States District Court for the Northern District of California, filed Jul. 18, 2013.
*Incase Designs, Corp. v. Mophie, Inc.*, Case No. 3:2013-CV-04314 in the United States District Court for the Northern District of California, filed Sep. 18, 2013.
Mophie Motion 1—To Be Accorded Benefit, filed Nov. 20, 2013 in Patent Interference No. 105,946.
Declaration of John Feland, Ph.D, in Support of Mophie Motion 1 to Be Accorded Benefit, dated Nov. 20, 2013, in Patent Interference No. 105,946.
Morphie Motion 2—For Judgement that Incase's Involved Claims Are Unpatentable, filed Nov. 20, 2013 in Parent Interference No. 105,946.
Declaration of John Feland, Ph.D, in Support of Mophie Motion 2 for Judgement That Incase's Involved Claims Are Unpatentable, dated Nov. 20, 2013, in Patent Interference No. 105,946.
Incase Motion 1—Motion for Benefit; filed Nov. 20, 2013 in Patent Interference No. 105,946.
Incase Motion 2—Motion to Undesignate Claims, filed Nov. 20, 2013 in Patent Interference No. 105,946.
Incase Motion 3—Motion for Judgment Based on Lack of Written Description, filed Nov. 20, 2013 in Patent Interference No. 105,946.
Incase Motion 4—Motion for Unpatentability of Mophie Claims, filed Nov. 20, 2013 in Patent Interference No. 105,946.
Declaration of Andrew Wolfe, filed Nov. 20, 2013 in Patent Interference No. 105,946.
Declaration of Thomas Overthun, filed Nov. 20, 2013 in Patent Interference No. 105,946.
Declaration of Gabriel Dan, filed Nov. 20, 2013 in Patent Interference No. 105,946.
Mophie's Third Amended Complaint, filed Jun. 27, 2014, in *Mophie, Inc. v. Source Vista*, Case No. 8:13-CV-01321 in the United States District Court for the Central District of California.
LivingSocial's Answer to Mophie's Fifth Amended Complaint and Counterclaims, filed Sep. 24, 2014, in *Mophie, Inc. v. Source Vista*, Case No. 8:13-CV-01321 in the United States District Court for the Central District of California.
Shah's Answer, Affirmative Defenses, and Counterclaims to Plaintiff's Fifth Amended Complaint, filed Sep. 24, 2014, in *Mophie, Inc. v. Source Vista*, Case No. 8:13-CV-01321 in the United States District Court for the Central District of California.
Expert Report of Dr. David Munson, dated Aug. 28, 2014, in *Mophie, Inc. v. Source Vista*, Case No. 8:13-CV-01321 in the United States District Court for the Central District of California.
Expert Report of John Feland, Ph.D, dated Aug. 28, 2014, in *Mophie, Inc. v. Source Vista*, Case No. 8:13-CV-01321 in the United States District Court for the Central District of California.
Rebutal Expert Report of John Feland, Ph.D, dated Sep. 25, 2014, in *Mophie, Inc. v. Source Vista*, Case No. 8:13-CV-01321 in the United States District Court for the Central District of California.
Rebutal Expert Report of Dr. David Munson, dated Sep. 25, 2014, in *Mophie, Inc. v. Source Vista*, Case No. 8:13-CV-01321 in the United States District Court for the Central District of California.
Mophie's Second Amended Response to LivingSocial's Interrogatory No. 1[21], dated Aug. 28, 2014, in *Mophie, Inc. v. Source Vista*, Case No. 8:13-CV-01321 in the United States District Court for the Central District of California.
Mophie's Second Amended Response to Serve Global's Interrogatory No. 2, dated Aug. 28, 2014, in *Mophie, Inc. v. Source Vista*, Case No. 8:13-CV-01321 in the United States District Court for the Central District of California.
Defendant's Memorandum in Support of Motion for Partial Summary Judgement, dated Sep. 23, 2014, in *Mophie, Inc. v. Source Vista*, Case No. 8:13-CV-01321 in the United States District Court for the Central District of California.
Declaration of David Munson in Support of Defendant's Motion for Partial Summary Judgment, dated Sep. 22, 2014, in *Mophie, Inc. v. Source Vista*, Case No. 8:13-CV-01321 in the United States District Court for the Central District of California.
John Feland, Ph.D. Deposition Transcript, dated Sep. 30, 2014, in *Mophie, Inc. v. Source Vista*, Case No. 8:13-CV-01321 in the United States District Court for the Central District of California.
Matthew Brand Deposition Transcript, dated Jul. 23, 2014, in *Mophie, Inc. v. Source Vista*, Case No. 8:13-CV-01321 in the United States District Court for the Central District of California.
Dharmesh Shah Deposition Transcript, dated Jul. 11, 2014, in *Mophie, Inc. v. Source Vista*, Case No. 8:13-CV-01321 in the United States District Court for the Central District of California.
Defendants' Statement of Uncontroverted Material Fact and Contentions of Law, filed Sep. 22, 2014 in *Mophie, Inc. v. Source Vista*, Case No. 8:13-CV-01321 in the United States District Court for the Central District of California.
Memorandum of Points and Authorities in Support of Mophie's Motion for Summary Judgment, filed Sep. 22, 2014, in *Mophie, Inc. v. Source Vista*, Case No. 8:13-CV-01321 in the United States District Court for the Central District of California.
Statement of Uncontroverted Facts and Conclusions of Law in Support of Mophie's Motion for Summary Judgment, filed Sep. 22, 2014, in *Mophie, Inc. v. Source Vista*, Case No. 8:13-CV-01321 in the United States District Court for the Central District of California.
Mophie's Opposition to Shah and Serve Global's Motion for Partial Summary Judgment, dated Oct. 3, 2014, in *Mophie, Inc. v. Source Vista*, Case No. 8:13-CV-01321 in the United States District Court for the Central District of California.
Statement of Genuine Disputes of Material Fact in Opposition to Shah and Serve Global's Motion for Partial Summary Judgment, filed Oct. 3, 2014, in *Mophie, Inc. v. Source Vista*, Case No. 8:13-CV-01321 in the United States District Court for the Central District of California.
Opposition of LivingSocial to Mophie's Motion for Summary Judgment, dated Oct. 3, 2014, in *Mophie, Inc. v. Source Vista*, Case No. 8:13-CV-01321 in the United States District Court for the Central District of California.
Defendants' Opposition to Plaintiff's Motion for Summary Judgment, filed Oct. 3, 2014, in *Mophie, Inc. v. Source Vista*, Case No. 8:13-CV-01321 in the United States District Court for the Central District of California.

(56) References Cited

OTHER PUBLICATIONS

Defendants' Response to Plaintiffs Statement of Uncontroverted Material Fact and Contentions of Law, filed Oct. 3, 2014, in *Mophie, Inc. v. Source Vista*, Case No. 8:13-CV-01321 in the United States District Court for the Central District of California.
David Munson Deposition Transcript, dated Sep. 29, 2014, in *Mophie, Inc. v. Source Vista*, Case No. 8:13-CV-01321 in the United States District Court for the Central District of California.
Mophie's First Amended Complaint, filed Jun. 25, 2014, in *Mophie, Inc. v. UNU Electronics Inc.*, Case No. 8:13-CV-01705 in the United States District Court for the Central District of California.
UNU's Answer and Counterclaims, filed Jul. 10, 2014, in *Mophie, Inc. v. UNU Electronics Inc.*, Case No. 8:13-CV-01705 in the United States District Court for the Central District of California.
Mophie's Responses to Defendant's Third Set of Interrogatories (No. 12), dated Aug. 21, 2014, in *Mophie, Inc. v. UNU Electronics Inc.*, Case No. 8:13-CV-01705 in the United States District Court for the Central District of California.
Mophie's Responses to Defendant's First set of Requests for Admissions (Nos. 1-46), dated Aug. 19, 2014, in *Mophie, Inc. v. UNU Electronics Inc.*, Case No. 8:13-CV-01705 in the United States District Court for the Central District of California.
Mophie's Responses to Defendant's Second set of Requests for Admissions (Nos. 47-109), dated Aug. 19, 2014, in *Mophie, Inc. v. UNU Electronics Inc.*, Case No. 8:13-CV-01705 in the United States District Court for the Central District of California.
Request for Ex Parte Reexamination of U.S. Pat. No. 8,367,235, filed Aug. 14, 2014.
Corrected Request for Ex Parte Reexamination of U.S. Pat. No. 8,367,235, filed Sep. 18, 2014.
Declaration of John Feland, Ph.D. In Support of Mophie's Opposition to Defendants Motion for Partial Summary Judgment, filed Oct. 3, 2014, in *Mophie, Inc. v. Source Vista*, Case No. 8:13-CV-01321 in the United States District Court for the Central District of California.
LivingSocial's Reply in Support of Motion for Summary Judgment, Filed Oct. 10, 2014, in *Mophie, Inc. v. Source Vista*, Case No. 8:13-CV-01321 in the United States District Court for the Central District of California.
Defendants' Reply in Support of Motion for Partial Summary Judgment, Filed Oct. 10, 2014, in *Mophie, Inc. v. Source Vista*, Case No. 8:13-CV-01321 in the United States District Court for the Central District of California.
Reply in Support of Mophie's Motion for Summary Judgment, Filed Oct. 10, 2014, in *Mophie, Inc. v. Source Vista*, Case No. 8:13-CV-01321 in the United States District Court for the Central District of California.
Mophie's Reply to Counterclaims of LivingSocial, filed Oct. 14, 2014, in *Mophie, Inc. v. Source Vista*, Case No. 8:13-CV-01321 in the United States District Court for the Central District of California.
Mophie's Reply to Counterclaims of Shah, filed Oct. 14, 2014, in *Mophie, Inc. v. Source Vista*, Case No. 8:13-CV-01321 in the United States District Court for the Central District of California.
Defendant's Response to Mophie's Fourth Set of Interrogatories, dated Sep. 23, 2014, in *Mophie, Inc. v. UNU Electronics Inc.*, Case No. 8:13-CV-01705 in the United States District Court for the Central District of California.
Plaintiff Mophie's Preliminary Claim Constructions and Identification of Extrinsic Evidence, dated Oct. 14, 2014, in *Mophie, Inc. v. UNU Electronics Inc.*, Case No. 8:13-CV-01705 in the United States District Court for the Central District of California.
Defendant's Preliminary Claim Constructions and Extrinsic Evicence, dated Oct. 14, 2014, in *Mophie, Inc. v. UNU Electronics Inc.*, Case No. 8:13-CV-01705 in the United States District Court for the Central District of California.
Plaintiff Mophie's Opening Brief on Claim Construction, filed Oct. 29, 2014, in *Mophie, Inc. v. UNU Electronics Inc.*, Case No. 8:13-CV-01705 in the United States District Court for the Central District of California.

Declaration of John Feland, Ph.D. In Support of Plaintiff's Preliminary Claim Constructions, filed Oct. 29, 2014, in *Mophie, Inc. v. UNU Electronics Inc.*, Case No. 8:13-CV-01705 in the United States District Court for the Central District of California.
Supplemental Declaration of John Feland, Ph.D. In Support of Plaintiff's Claim Constructions, filed Oct. 29, 2014, in *Mophie, Inc. v. UNU Electronics Inc.*, Case No. 8:13-CV-01705 in the United States District Court for the Central District of California.
Declaration of Sheila N. Swaroop in Support of Mophie's Opening Claim Construction Brief, filed Oct. 29, 2014, in *Mophie, Inc. v. UNU Electronics Inc.*, Case No. 8:13-CV-01705 in the United States District Court for the Central District of California.
Transcript of Deposition of John Feland, dated Oct. 21, 2014, in *Mophie, Inc. v. UNU Electronics Inc.*, Case No. 8:13-CV-01705 in the United States District Court for the Central District of California.
Defendant's Opening Claim Construction Brief, dated Oct. 29, 2014, in *Mophie, Inc. v. UNU Electronics Inc.*, Case No. 8:13-CV-01705 in the United States District Court for the Central District of California.
Order Granting Request for Ex Parte Reexamination of U.S. Pat. No. 8,367,235, in Reexamination Control No. 90/013,319, dated Oct. 24, 2014.
Order Re LivingSocial's Motion for Summary Judgment, Mophie's Motion for Summary Judgment, Source Vista and Shah's Motion for Partial Summary Judgment, and Mophie's Motion to Bifurcate, dated Nov. 12, 2014, in *Mophie, Inc. v. Source Vista*, Case No. 8:13-CV-01321 in the United States District Court for the Central District of California.
Mophie's Memorandum in Support of its Motion for Reconsideration, filed Nov. 19, 2014, in *Mophie, Inc. v. Source Vista*, Case No. 8:13-CV-01321 in the United States District Court for the Central District of California.
Declaration of Sheila N. Swaroop in Support of Mophie's Motion for Reconsideration, filed Nov. 19, 2014, in *Mophie, Inc. v. Source Vista*, Case No. 8:13-CV-01321 in the United States District Court for the Central District of California.
Order Denying Plaintiff's Motion for Reconsideration, dated Nov. 21, 2014, in *Mophie, Inc. v. Source Vista*, Case No. 8:13-CV-01321 in the United States District Court for the Central District of California.
Defendants Dharmesh Shah and Serve Global, LLC's Memorandum of Points and Authorities in Support of Defendants's Motion for Attorney's Fees, filed Mar. 21, 2015, in *Mophie, Inc. v. Source Vista*, Case No. 8:13-CV-01321 in the United States District Court for the Central District of California.
Memorandum of Points and Authorities in Support of Livingsocial, Inc.'s Motion for Legal Fees and Costs, filed Mar. 20, 2015, in *Mophie, Inc. v. Source Vista*, Case No. 8:13-CV-01321 in the United States District Court for the Central District of California.
Plaintiff Mophie, Inc.'s Opposition to Defendants Dharmesh Shah and Serve Global, LLC's Motion for Attorneys' Fees, filed Apr. 3, 2015, in *Mophie, Inc. v. Source Vista*, Case No. 8:13-CV-01321 in the United States District Court for the Central District of California.
Plaintiff Mophie, Inc.'s Opposition to Defendant Livingsocial, Inc.'s Motion for Attorneys' Fees, filed Apr. 3, 2015, in *Mophie, Inc. v. Source Vista*, Case No. 8:13-CV-01321 in the United States District Court for the Central District of California.
Reply to Plaintiff's Opposition to Defendants Dharmesh Shah and Serve Global, LLC's Motion for Attorney's Fees, filed Apr. 10, 2015, in *Mophie, Inc. v. Source Vista*, Case No. 8:13-CV-01321 in the United States District Court for the Central District of California.
Reply in Support of Livingsocial, Inc.'s Motion for Legal Fees and Costs, filed Apr. 10, 2015, in *Mophie, Inc. v. Source Vista*, Case No. 8:13-CV-01321 in the United States District Court for the Central District of California.
Daniel Huang Deposition Transcript (Redacted) with Exhibit 121, dated Aug. 21, 2014, in *Mophie, Inc. v. Source Vista*, Case No. 8:13-CV-01321 in the United States District Court for the Central District of California.
Amended Final Judgment and Permanent Injunction, dated Dec. 11, 2015, in *Mophie, Inc. v. Source Vista*, Case No. 8:13-CV-01321 in the United States District Court for the Central District of California.

(56) References Cited

OTHER PUBLICATIONS

Order Re Motions for Attorneys' Fees, Motion to Amend Permanent Injunction, Motions for Judgment as a Matter of Law, Motion for Relief From Judgment, and Motion for New Trial, dated Dec. 11, 2015, in *Mophie, Inc.* v. *Source Vista*, Case No. 8:13-CV-01321 in the United States District Court for the Central District of California.

Mophie's Complaint, filed Dec. 16, 2015, in *Mophie, Inc.* v. *Cute Mobile Inc.*, Case No. 8:15-cv-02086 in the United States District Court for the Central District of California.

U.S. Appl. No. 29/539,419, filed Sep. 14, 2015, Dang et al.

U.S. Appl. No. 29/534,901, filed Jul. 31, 2015, Dang et al.

\* cited by examiner

BATTERY CASE FOR MOBILE DEVICES

CROSS-REFERENCE TO RELATED APPLICATIONS

This application is a continuation of U.S. patent application Ser. No. 14/547,060 titled BATTERY PACK, HOLSTER, AND EXTENDIBLE PROCESSING AND INTERFACE PLATFORM FOR MOBILE DEVICES, filed on Nov. 18, 2014, which is a continuation of U.S. patent application Ser. No. 12/938,351, titled BATTERY PACK, HOLSTER, AND EXTENDIBLE PROCESSING AND INTERFACE PLATFORM FOR MOBILE DEVICES, filed on Nov. 2, 2010, which is a divisional of U.S. patent application Ser. No. 12/357,262, titled BATTERY PACK, HOLSTER, AND EXTENDIBLE PROCESSING AND INTERFACE PLATFORM FOR MOBILE DEVICES, filed on Jan. 21, 2009, which claims the benefit under 35 U.S.C. §119(e) of U.S. Provisional Patent Application No. 61/021,897, titled BATTERY PACK AND HOLSTER FOR MOBILE DEVICES, and filed Jan. 18, 2008, the disclosures of which are hereby expressly incorporated by reference for all purposes.

FIELD

One embodiment relates to battery packs and/or holsters and, more particular, to an external battery pack and/or holster for mobile electronic devices.

BACKGROUND

Many mobile devices (e.g., mobile phones, digital assistants, mobile communication devices, handheld computing devices, personal music/video/content players and storage devices) are often powered by battery power sources. Such battery power sources are often housed within the mobile device and may be changed and/or recharged as needed. However, as inure powerful mobile devices are designed, these tend to consume power more quickly, thereby shortening the time between charges. This tends to limit the usefulness of the mobile device since the user must find a power source to recharge the battery source and wait until it is recharged.

Additionally, after a certain number of recharges, a battery source may need to be replaced as it may no longer hold a charge. Oftentimes, it is not easy to replace a battery source as the mobile device may need to be disassembled or opened to reach the battery source.

Therefore, a way is needed to extend the time between charges of mobile devices and/or continue to power the mobile device even after an internal power source has been depleted.

SUMMARY

According to one embodiment, a battery pack for a mobile communication device is provided comprising a casing and one or more rechargeable power cells. The casing may define a cavity that conforms, at least partially, to the outer shape of the mobile communication device. Additionally, the casing may further define one or more access openings to permit access to integrated interfaces (e.g., power button, camera lens, audio jack, etc.) of the mobile communication device.

The one or more rechargeable power cells may be housed within the thickness of the casing. For example, the power cells may be housed within the thickness of a back plane of the casing. The casing may secure the mobile communication device within the cavity while at least one surface of the mobile communication device remains exposed.

The battery pack may also include an internal interface and/or external interface. The internal interface may engage a corresponding interface on the mobile communication device to provide power from the one or more rechargeable cells to the mobile communication device. The external interface may be electrically coupled to the internal interface in order to transmit signals from the mobile communication device to an external device. The external interface may further serve to recharge the one or more rechargeable power cells.

The battery pack may further comprise a recharging device integrated within the battery pack that wirelessly recharges the one or more rechargeable power cells. This may include an inductive electrical recharging system that requires no direct contact or can recharge at a distance.

According to one aspect, the battery pack may also include additional communication interfaces and/or processors. For instance, a plurality of communication interfaces may be coupled to the internal interface, wherein the mobile communication device can transmit and receive signals via the communication interfaces. Likewise, at least one processor within the battery pack may be coupled to the internal interface and adapted to collect information via one or more interfaces of the battery pack and provide the collected information to the mobile communication device. In one example, the at least one processor may be adapted to execute one or more instructions under the control of the mobile communication device.

The battery pack may also include a display interface integrated into the battery pack to display information to a user. Such display interface may allow expanding the display from the mobile communication device to the display interface.

According to one aspect, the thickness of the battery pack may be approximately or substantially the same as the thickness of the mobile communication device. For this purpose, the battery pack may be slim and/or have an ergonomic shape so that it does not significantly increase the thickness and/or size of the mobile communication device. Consequently, mobile communication device can be used within the battery pack for extended periods of time since the battery pack does not significantly increase the bulkiness of the mobile communication device.

According to one embodiment, a battery pack for a mobile device is provided, comprising: a back plane, a first and second sides, a bottom side, and one or more battery cells housed within the thickness of the back plane. The back plane and first, second and bottom sides may define a cavity for mounting the mobile device. The one or more battery cells may be rechargeable while a mobile device is mounted within the cavity. The battery pack may also include an internal interface that electrically couples the one or more battery cells to the mobile device.

Additionally, the battery pack may include one or more speakers housed within the thickness of the hack plane. The speakers may be electrically coupled to an interface to allow a mobile device mounted in the cavity to send audio signals through the one or more speakers. Similarly, the battery pack may include one or more microphones housed within the thickness of the back plane and electrically coupled to an interface to allow a mobile device mounted in the cavity to receive audio signals from the one or more microphones.

According to yet another aspect, the battery pack may include a plurality of communication interfaces coupled to the internal interface, wherein the mobile communication device can transmit and receive signals via the communication interfaces. The battery pack may also include at least one processor coupled to the internal interface and adapted to collect information via one or more of the plurality of communication interfaces and provide the collected information to the mobile communication device.

The thickness of the battery pack may be less than twice the thickness of the mobile communication device.

According to yet another feature a battery pack is provided comprising: (a) a holster defining a cavity that conforms, at least partially, to the outer shape of the mobile communication device; (b) one or more rechargeable power cells; and/or (c) an electrical connector to provide power from the one or more rechargeable power cells to the mobile communication device.

DETAILED DESCRIPTION

In the following detailed description of the invention, numerous specific details are set forth in order to provide a thorough understanding of the invention. However, the invention may be practiced without these specific details. In other instances, well known methods, procedures, and/or components have not been described in detail so as not to unnecessarily obscure aspects of the invention.

Various embodiments provide battery packs shaped to conform to the external shape of a mobile device, thereby providing a permanent or long-term replacement power source without significantly affecting the size and usability of the mobile device.

According to one feature, the battery pack may provide recharge power to the mobile device while also providing an external signaling and/or charging interface to the mobile device. This way, the mobile device need not be removed from the battery pack in order to charge it or provide data (e.g., synchronization, etc.).

According to yet another feature, the battery pack may include one or more different types of communication interfaces to extend the communication capabilities of the mobile device. This allows the mobile device to communicate via other interfaces that may not be built into the mobile device.

According to yet another feature, the battery pack may include one or more processors to extend the processing capabilities of the battery pack. For instance, the one or more processors may increase the processing capabilities of the battery pack and/or provide purpose-specific processors. That is, the interface between the battery pack and mobile device may allow the mobile device to use the one or more processors to execute application on the battery pack. Now that such applications may, in some instances, continue to operate even if the mobile device is detached from the battery pack.

According to yet another feature, the battery pack may include and inductive recharging device or a near-distance recharging device so that its power cells may be recharged without actually physically plugging it to a recharge power source.

First Embodiment of Battery Pack

Figure 1:
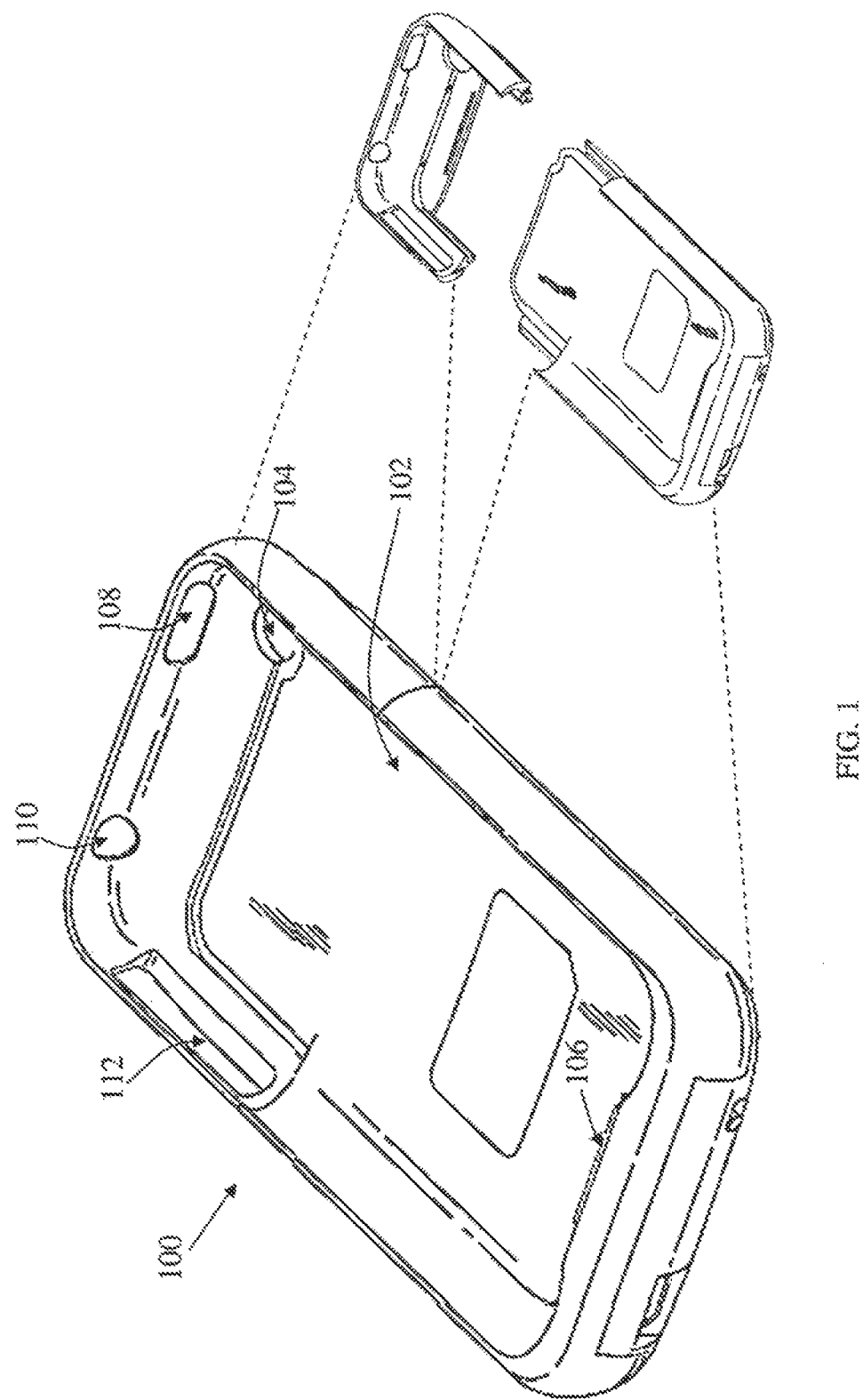
FIG. 1 illustrates a perspective view of a battery pack for a mobile device according to one example.

FIG. 1 illustrates a perspective view of a battery pack for a mobile device according to one example. In this example, the battery pack 100 is shaped to receive or house a mobile phone within a contoured cavity 102. The battery pack 100 has an integrated rechargeable power cell capable of providing power to operate and/or recharge a mobile device (e.g., iPhone™ by Apple Inc., etc.).

Figure 2:
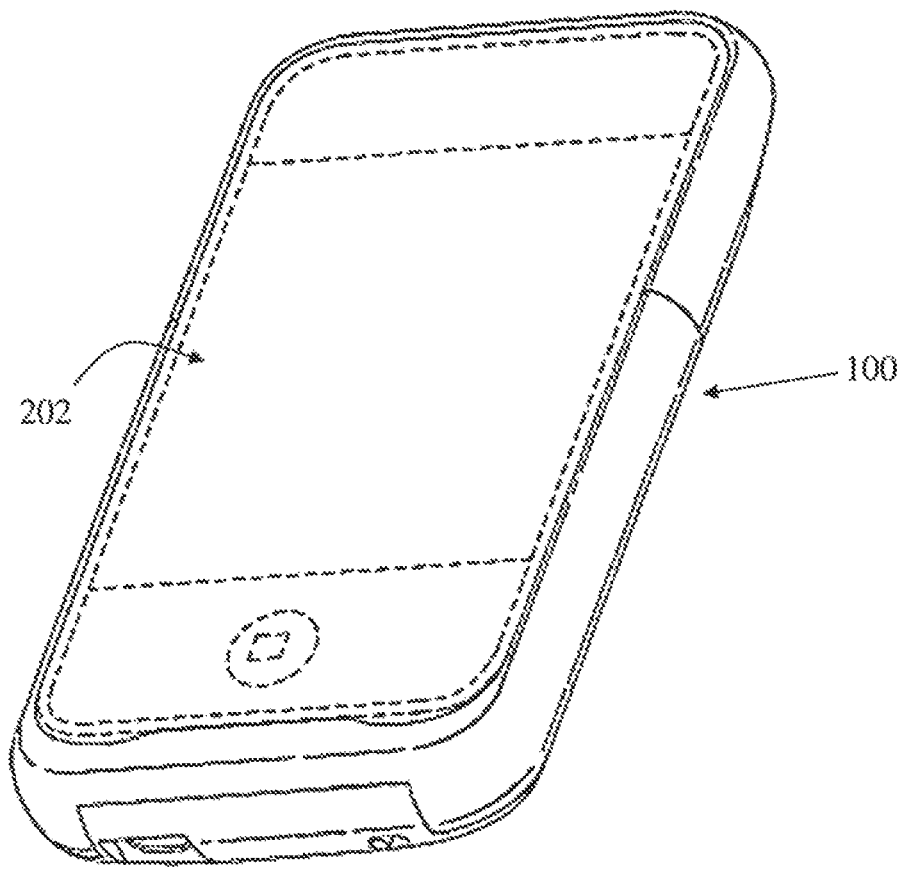
FIG. 2 illustrates how a mobile device can be housed within the battery pack of FIG. 1.

FIG. 2 illustrates how a mobile device can be housed within the battery pack 100 of FIG. 1. As can be appreciated from this figure, the battery pack 100 is shaped to closely wrap around the mobile device 202 and serves as a protective case for the mobile device 100.

Figure 3:
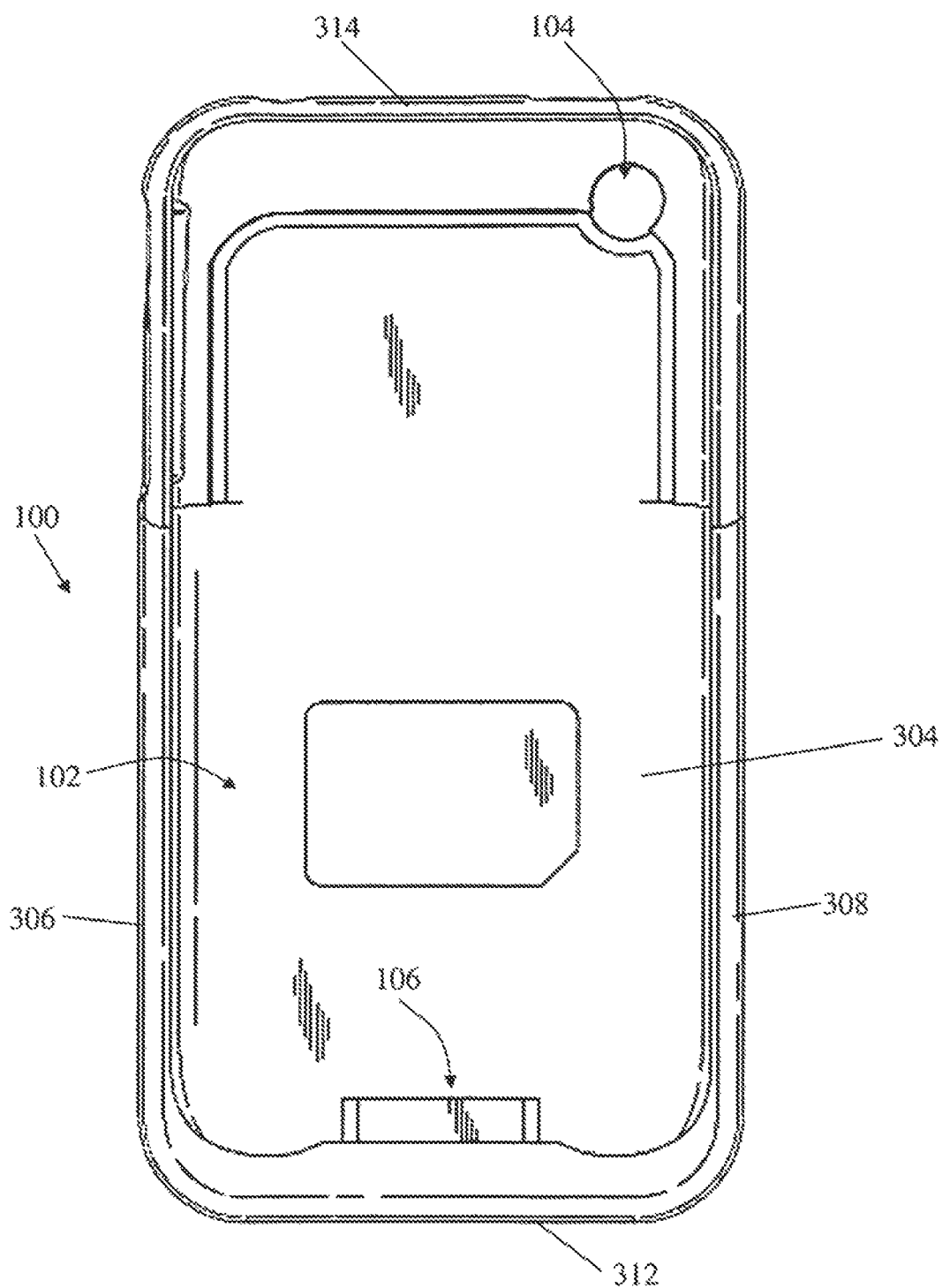
FIG. 3 illustrates a front view of the battery pack of FIG. 1.

FIG. 3 illustrates a front view of the battery pack 100 of FIG. 1. The battery pack 100 includes a hack plane 304, first and second sides 306 and 308, a bottom side 312, and a top side 314. The hack plane 304, first and second sides 306, bottom side 312 and top side 314 may be shaped to form a pocket or cavity 102 in which a mobile device to be powered can be housed. The top side 314 of the battery pack 100 may slide out to allow insertion and removal of the mobile device.

Referring again to FIG. 1, the battery pack 100 may include one or more openings 104, 108, 110, and 112 to facilitate access to various features of the mobile phone. For instance, a first opening 104 on the back plane 304 of the battery pack 100 may allow unobstructed view for a camera lens on the hack of the mobile device. A second Opening 108 may provide access to a screen on/off switch for the mobile device. A third opening 110 may provide access to an audio jack on the mobile device. A fourth opening 112 on the first side 306 may provide access to a volume control sliding switch.

The battery pack 100 may also include a connector or interface 106 within the cavity 102 (e.g., on the bottom side 312) through which power can be provided to the mobile device from the internal power cell of the battery pack 100. Additionally, the connector 106 may be coupled to an external interface to provide input and/or output signals to the mobile device.

From FIG. 1, it can be appreciated that the battery pack may include two sections that separate to allow insertion of the mobile device and can then be coupled together to secure the mobile device in place. The size and shape of the battery pack 100 may be approximately that of the external contour of a mobile device to which it is intended to provide power.

Figure 4:
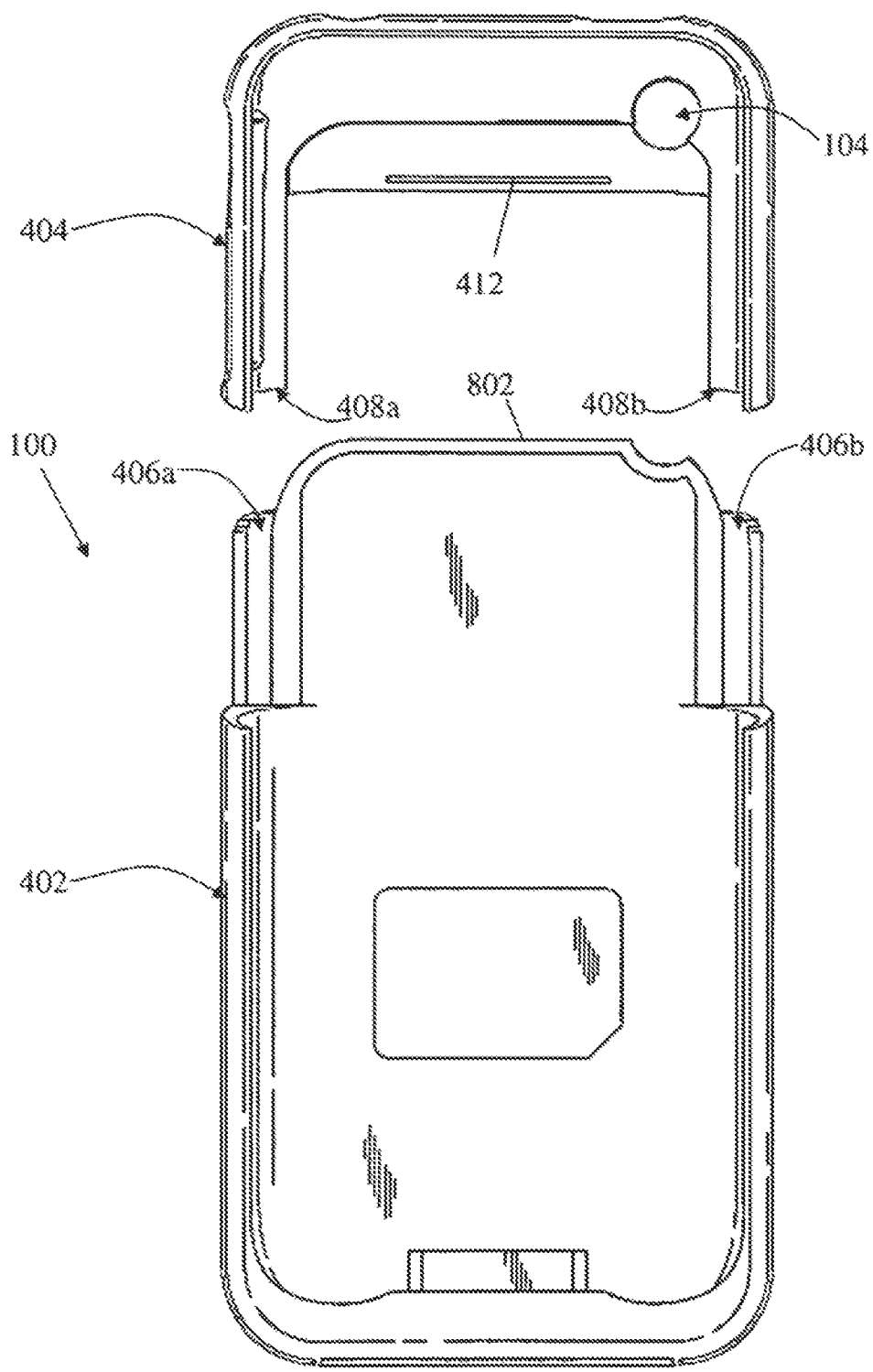
FIG. 4 illustrates the battery pack of FIG. 1 in an open configuration.

FIG. 4 illustrates the battery pack of FIG. 1 in an open configuration. The battery pack 100 may include a bottom section 402 and a top section 404 that can be separated from each other to insert a mobile device within the battery pack 100 and can then be coupled together secure the mobile device in place. For example, the bottom section 402 may include receiving grooves 406a and 406b that receive rails 408a and 408b from the top section 404. In this manner, the top section 404 can be coupled to the bottom section 402 by pressure fit. For example, a tongue section 802 (FIG. 8) may slide on to the top section 404 such that an engaging tab 412 couples into a receiving groove 804 (FIG. 8) to secure the top section 404 to the bottom section 402.

Figure 5:
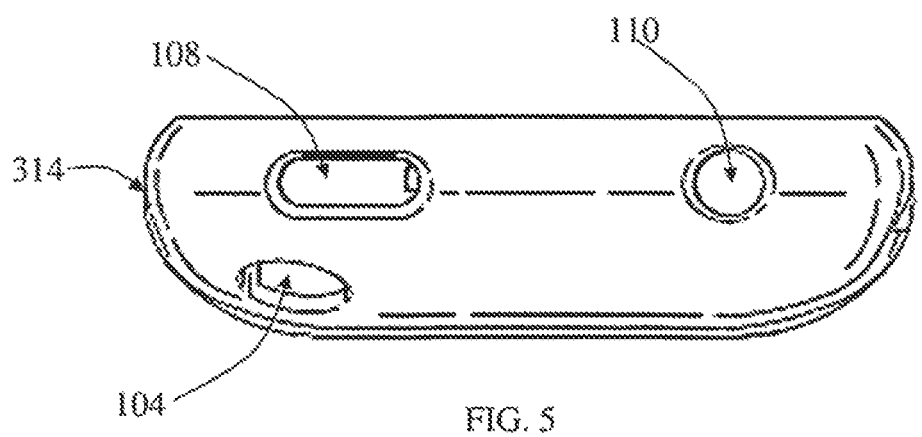
FIG. 5 illustrates a top view of the battery pack of FIG. 1.

FIG. 5 illustrates a top view of the battery pack 100 of FIG. 1. In this view, the top side 314 of the battery pack 100 is shown and the first opening 104, second opening 108, and third opening 110 can be appreciated.

Figure 6:
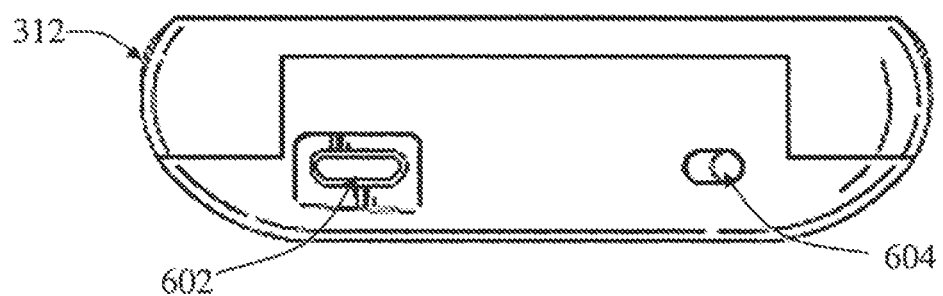
FIG. 6 illustrates a bottom view of the battery pack of FIG. 1.

FIG. 6 illustrates a bottom view of the battery pack 100 of FIG. 1. In this view, the bottom side 312 of the battery pack 100 is shown. In this view, an external interface 602 (e.g., micro USB connector) is shown. This external interface 602 may serve to recharge the internal power cell of the battery pack. Additionally, the external interface 602 may also provide a pass-through signaling interface for the internal connector or interface 106, thereby allowing the mobile device to communicate via the external interface 602. A switch 604 may also be located on the bottom side 312 of the battery pack and can function to switch power from the battery pack On or Off. That is, when the mobile device has sufficient power on its own, the power cell of the battery pack is not needed and can be switched Off until it is needed.

Figure 7:
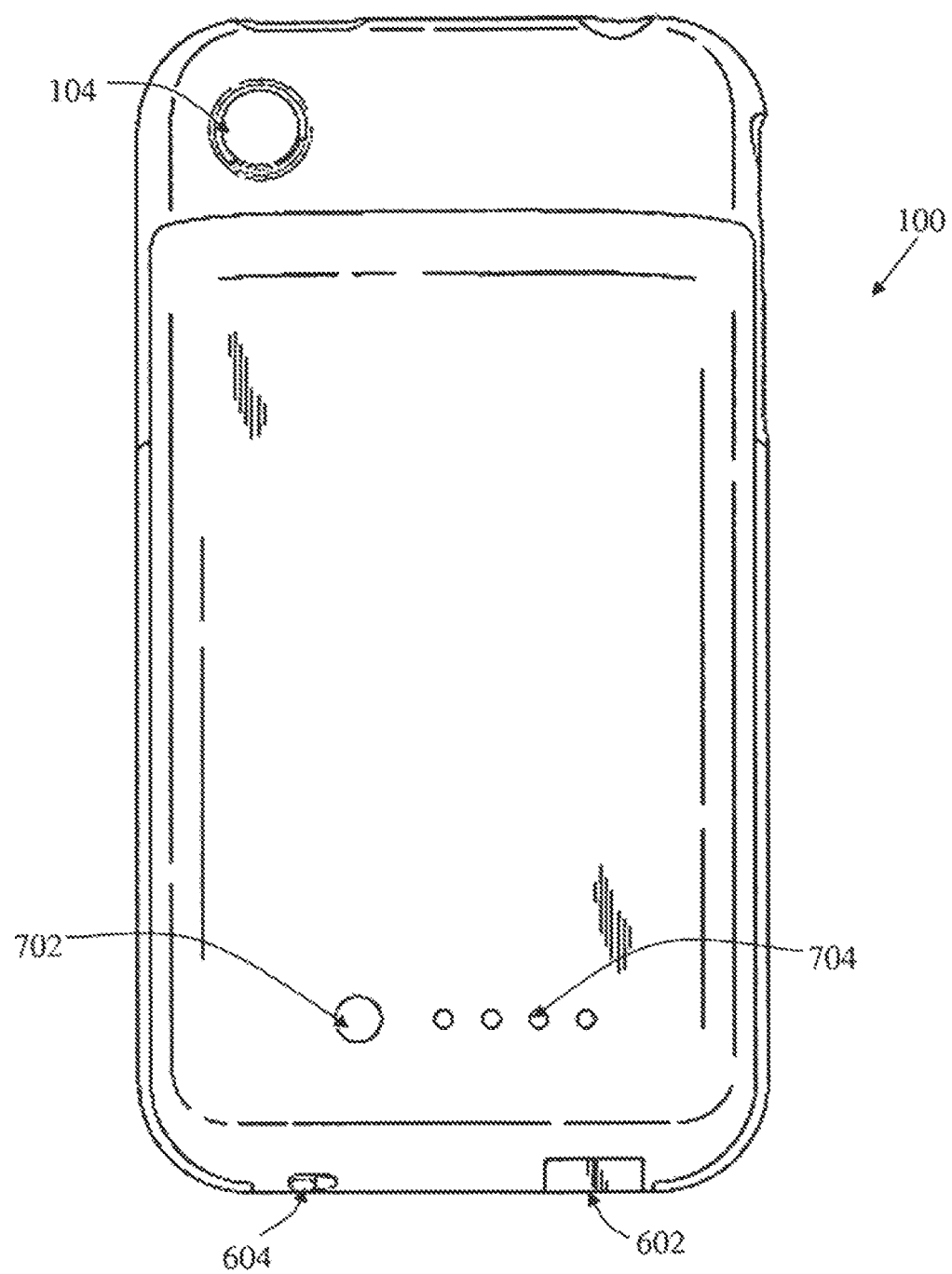
FIG. 7 illustrates a back view of the battery pack of FIG. 1.

FIG. 7 illustrates a hack view of the battery pack 100 of FIG. 1. In this example, a test button 702 is provided that, when pushed, causes plurality of LED lights 704 to indicate the power or charge level of the internal power cell of the battery pack 100.

Figure 8:
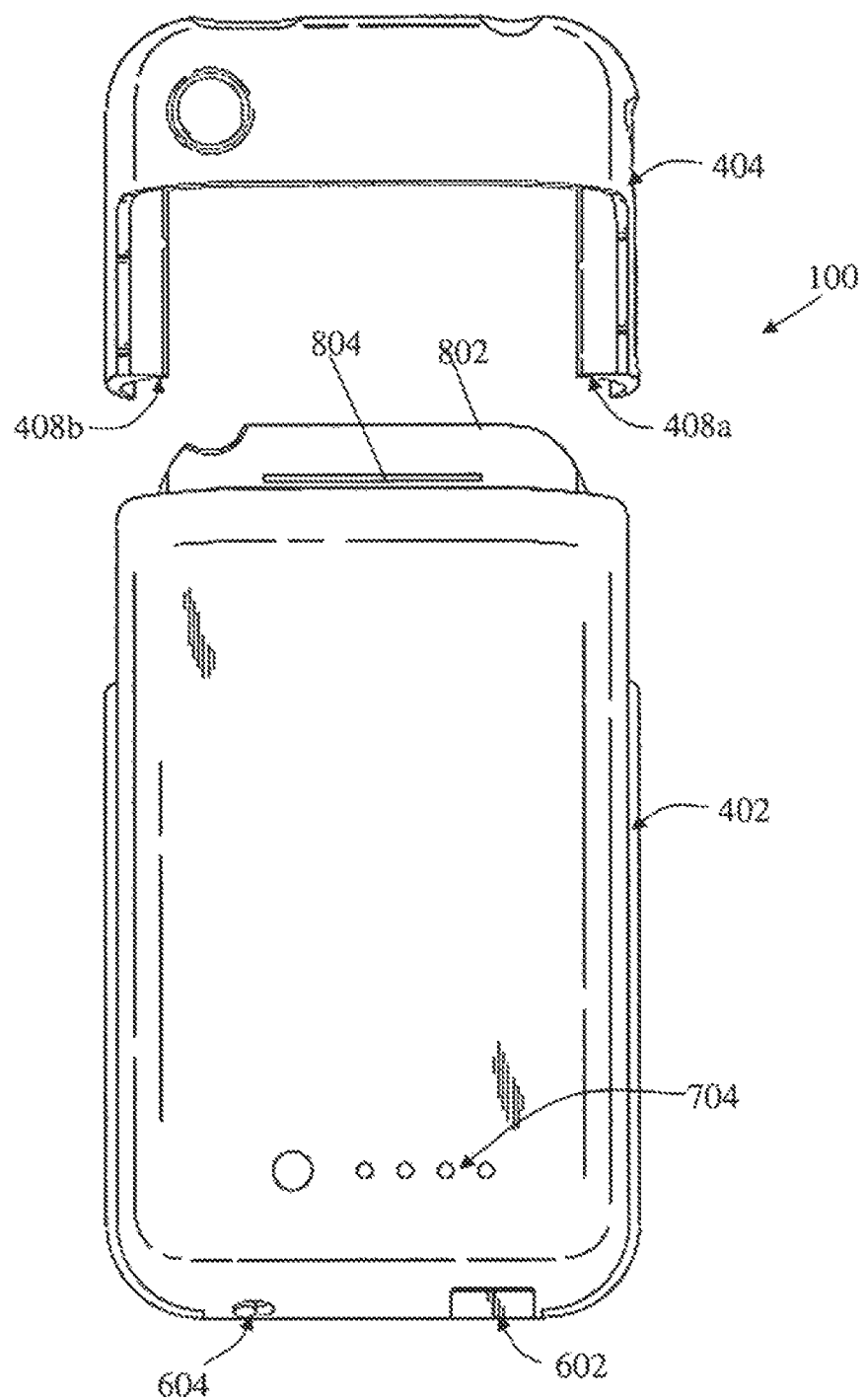
FIG. 8 illustrates back view of the battery pack of FIG. 1 in an open position.

FIG. 8 illustrates hack view of the battery pack 100 of FIG. 1 in an open position.

Figure 9:
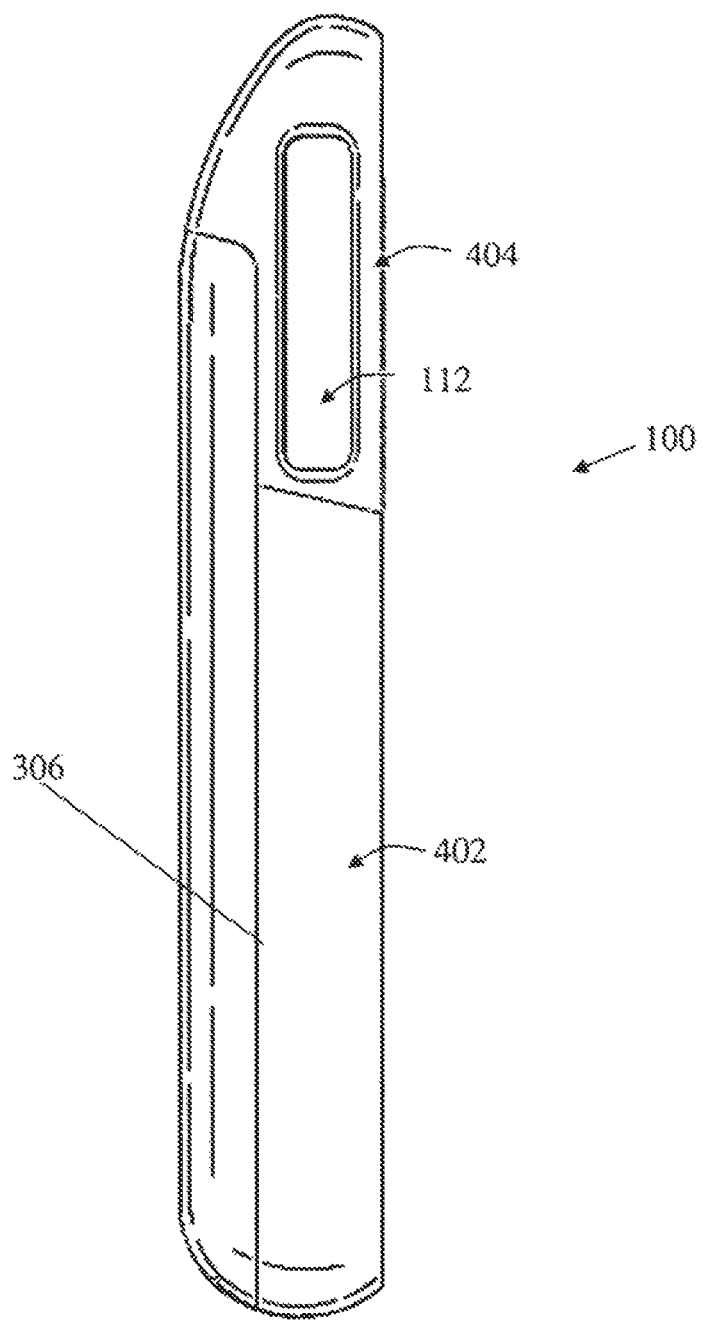
FIG. 9 illustrates a first side view of the battery pack of FIG. 1.

FIG. 9 illustrates a first side view of the battery pack of FIG. 1.

Figure 10:
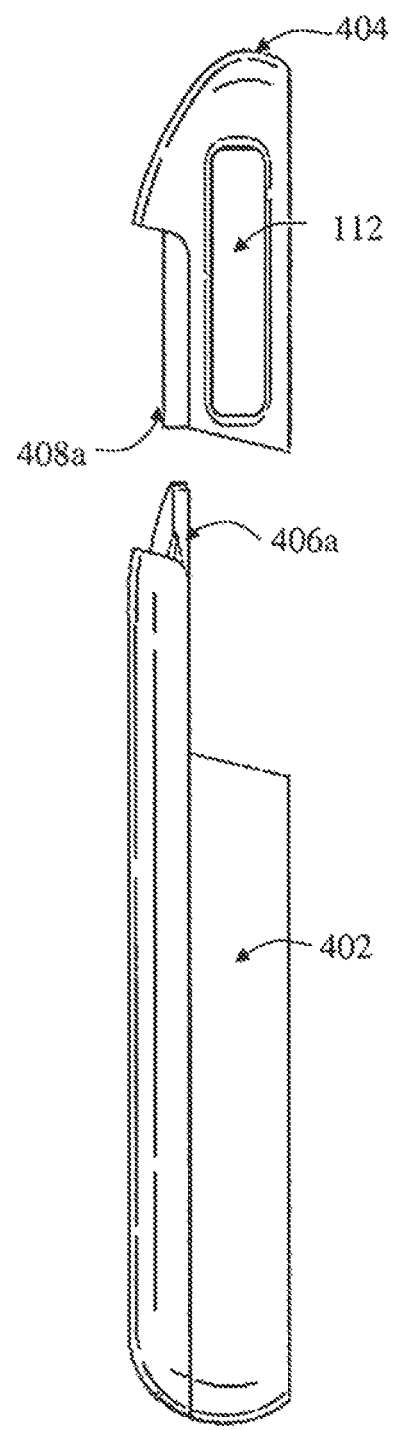
FIG. 10 illustrates the first side view of the battery pack of FIG. 1 in an open position.

FIG. 10 illustrates the first side view of the battery pack of FIG. 1 in an open position.

Figure 11:
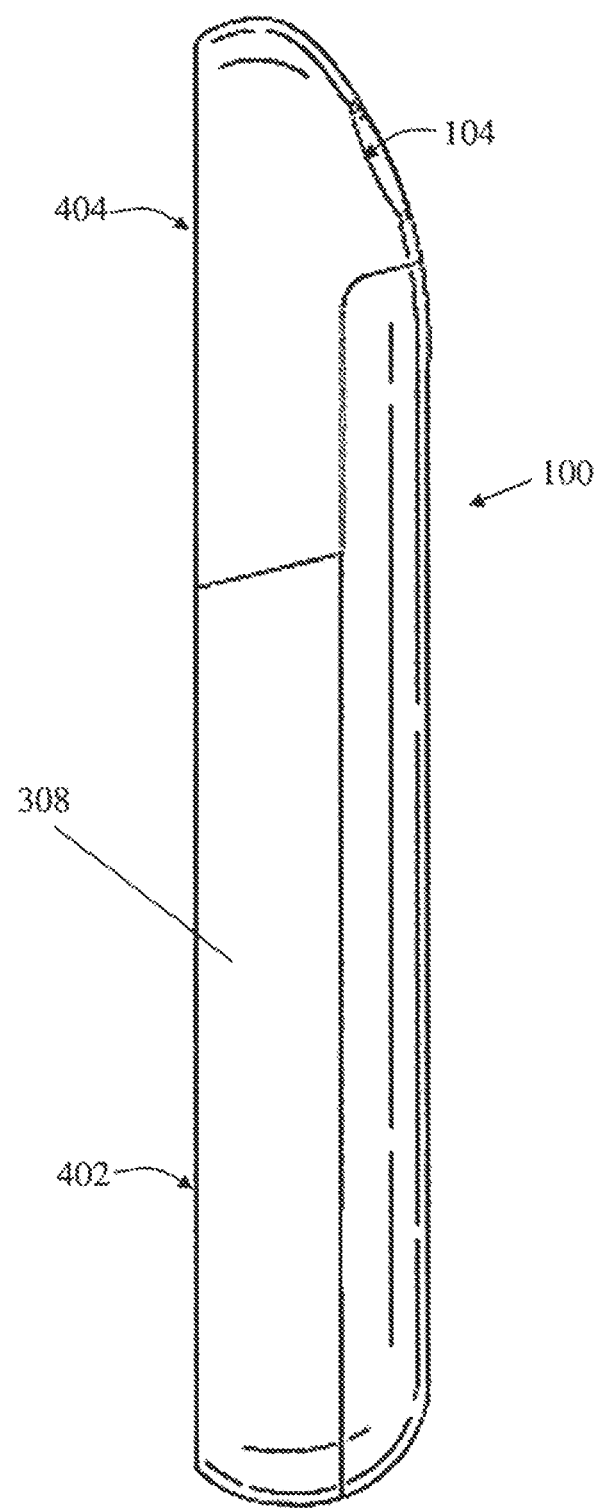
FIG. 11 illustrates a second side view of the battery pack of FIG. 1.

FIG. 11 illustrates a second side view of the battery pack of FIG. 1.

Figure 12:
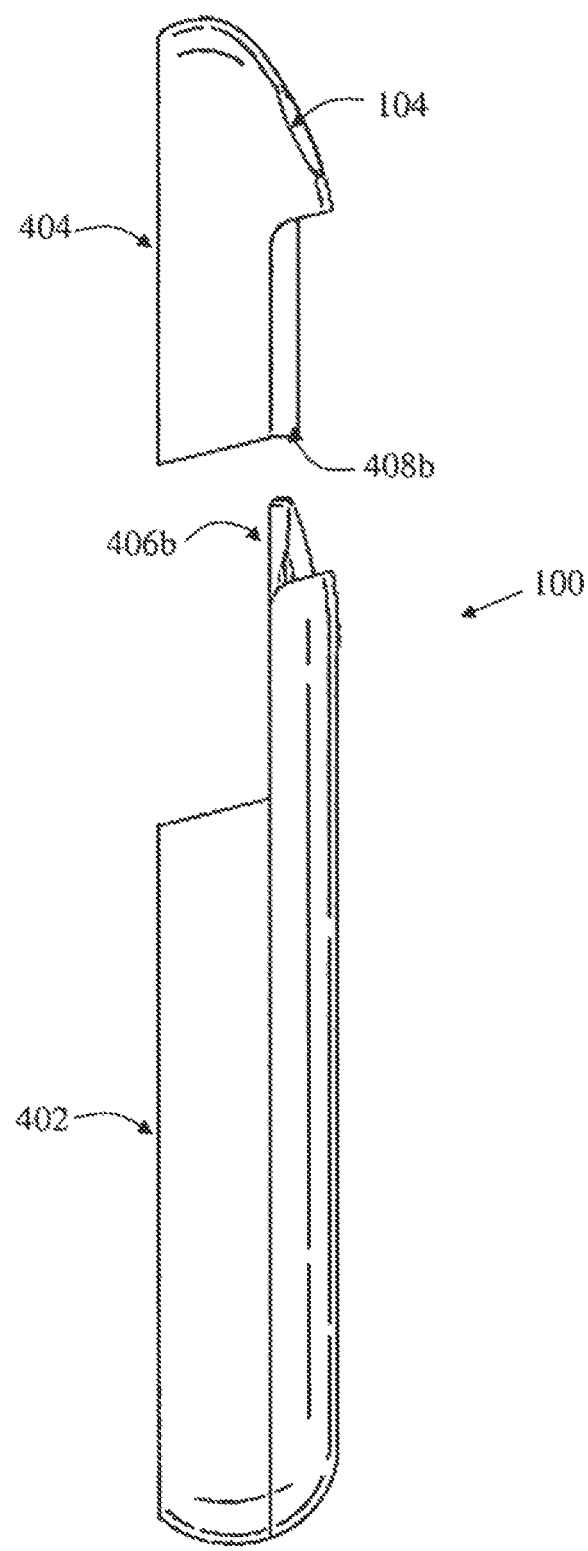
FIG. 12 illustrates the second side view of the battery pack of FIG. 1 in an open position.

FIG. 12 illustrates the second side view of the battery pack of FIG. 1 in an open position.

Figure 13:
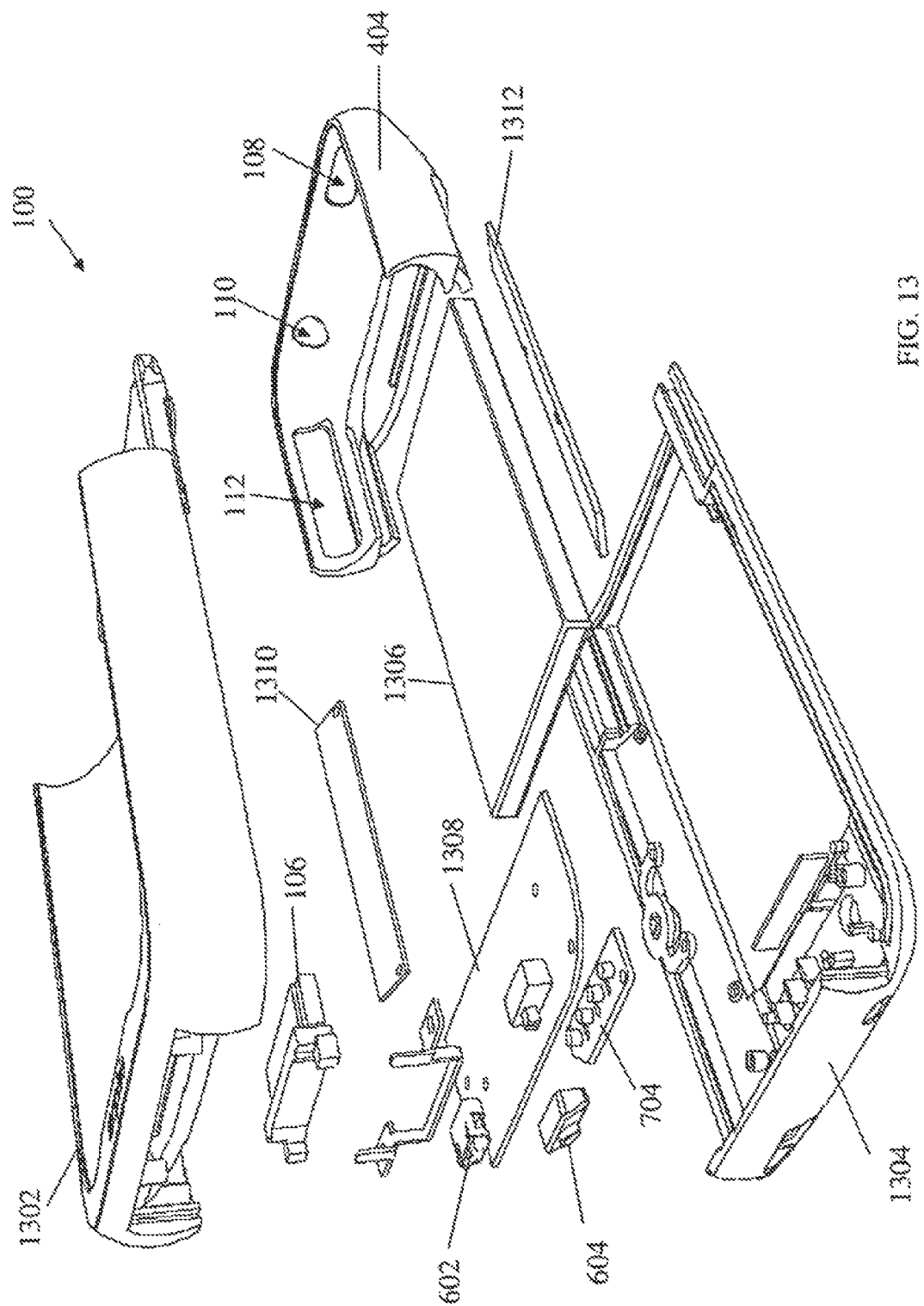
FIG. 13 is an exploded view of components of the battery pack of FIG. 1.

FIG. 13 is an exploded view of components of the battery pack of FIG. 1. In this example, the battery pack may include a first bottom section 1302 and a second bottom section 1304 which form a top and bottom shell in between which one or more circuit boards 1308, 1310, and/or 1312 and/or one or more power cells 1306 are housed. That is, the circuits hoards 1308, 1310, 1312 and/or power cell(s) 1306 are sandwiched between the top and bottom sections 1302 and 1304 of the battery pack 100. Consequently, the rechargeable power cell(s) 1306 may be housed within the thickness of the back plane of the battery pack.

In some instance, the circuit boards and or power cell of the battery pack may cause interference with the antenna or signaling of the mobile device which is in close proximity. Consequently, one aspect provides for reducing the size of a primary circuit hoard 1308 by adding secondary circuit boards 1310 and 1312 which are electrically coupled to the primary circuit hoard 1308. This allows reducing the size of the circuit board 1308 thereby reducing interference to the antenna of the mobile device. Additionally, the ground for the power cell 1306 may be coupled to the ground for the mobile device (via the internal interface 106) to reduce interference to the mobile device.

Figure 14:
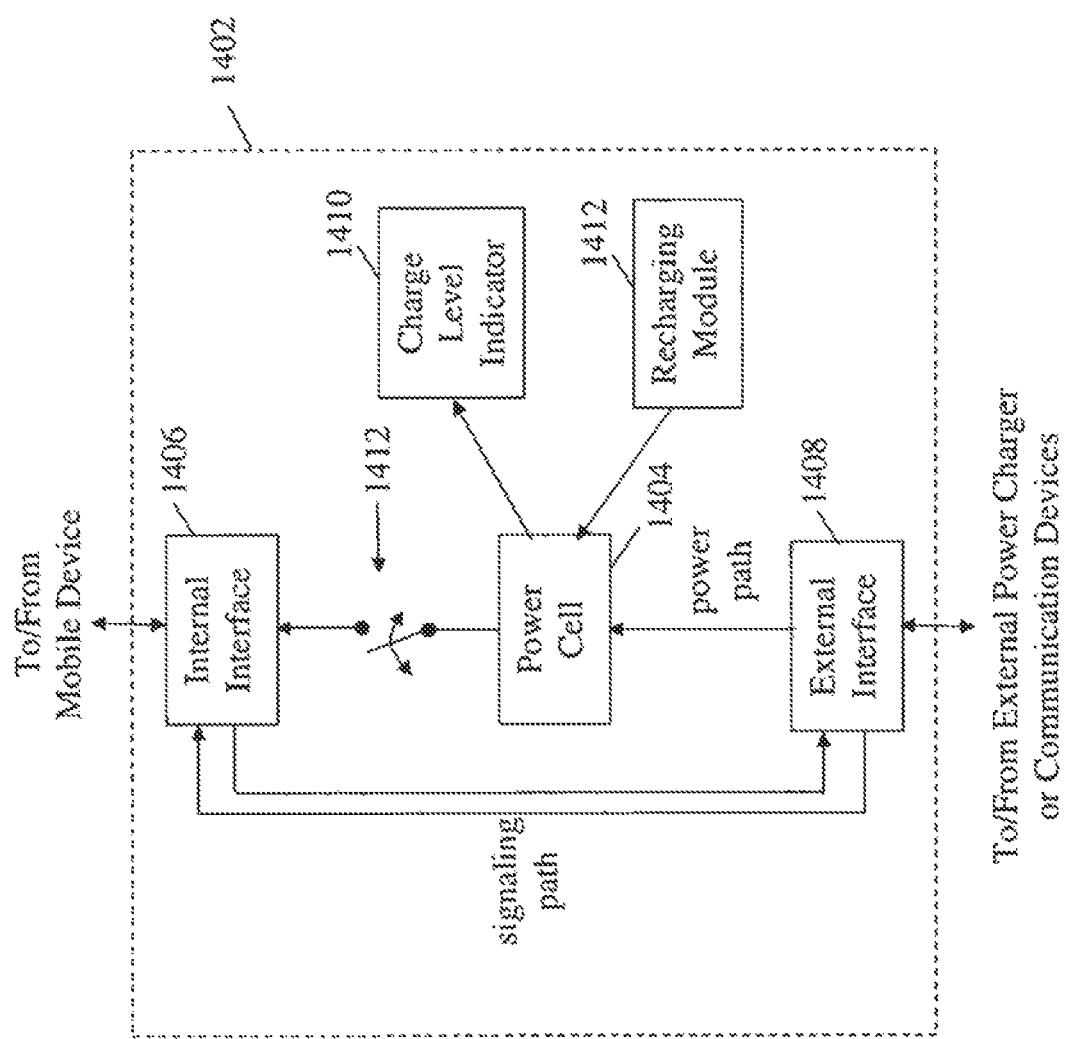
FIG. 14 illustrates a block diagram for the battery pack of FIG. 1.

FIG. 14 illustrates a block diagram for the battery pack 100 of FIG. 1. The battery pack 1402 may include a power cell 1404, an internal interface 1406, an external interface 1408, and charge level indicator 1410. The internal interface 1406 may be adapted to provide a mobile device power from the power cell 1404 as well as passing signal to/from the mobile device to the external interface 1408. The external interface 1408 may allow recharging of the power cell 1404 as well as passing signals to/from the mobile device via the internal interlace 1406. A switch 1412 may allow switching power from the power cell 1404 to the mobile device On and Off as desired. Also, a charge level indicator 1410 permits displaying of the charge level of the power cell 1404. Additionally, a recharging module 1412 serves to recharge to power cell 1404 when needed.

Second Embodiment of Battery Pack

FIGS. 15-16 and 18-22 illustrate yet another embodiment of the power pack. In this embodiment, the power pack may operate as previously disclosed but does not include a top section. By removing the top section, the battery pack is more compact in size and ergonomic so that it does not significantly increase or change the size, thickness, and/or shape of mobile communication device 1602 secured thereto.

Figure 15:
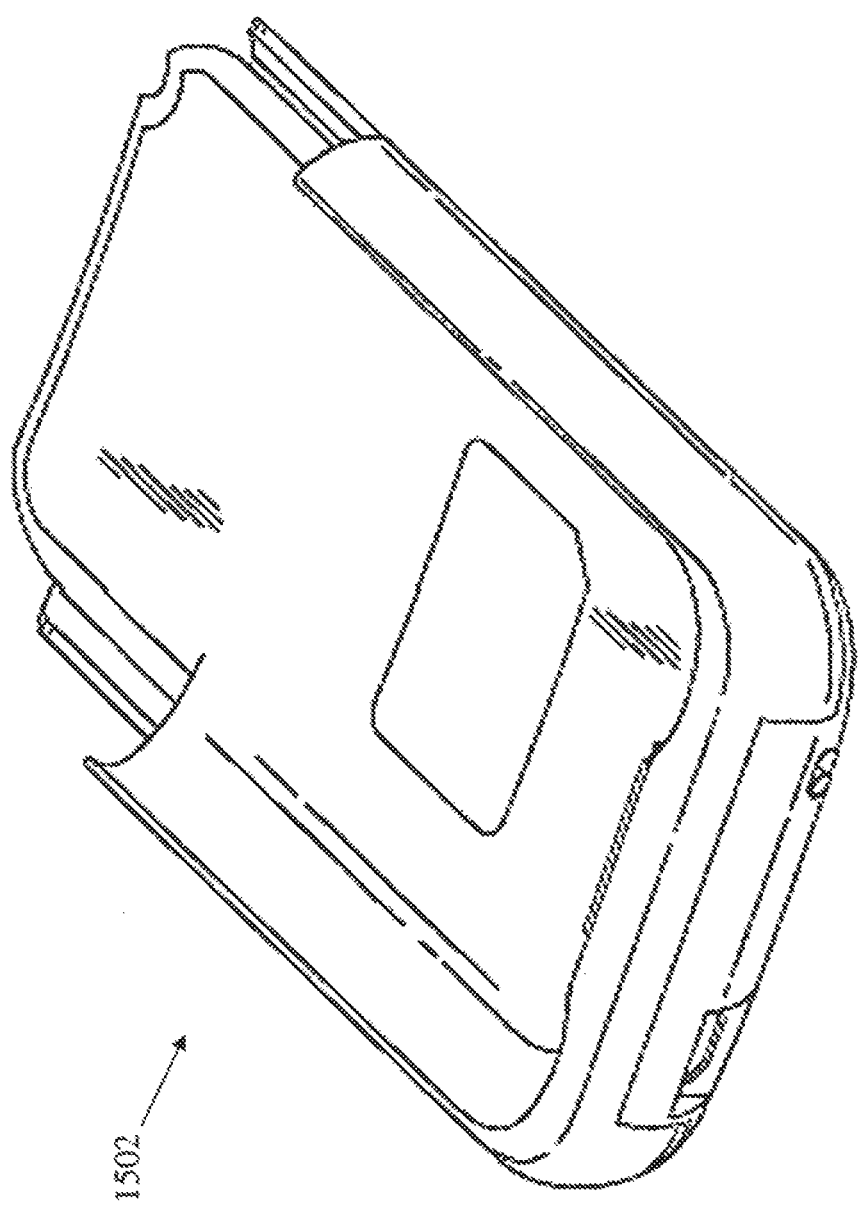
FIG. 15 illustrates a perspective view of the battery pack.

FIG. 15 illustrates a perspective view of the battery pack 1502.

Figure 16:
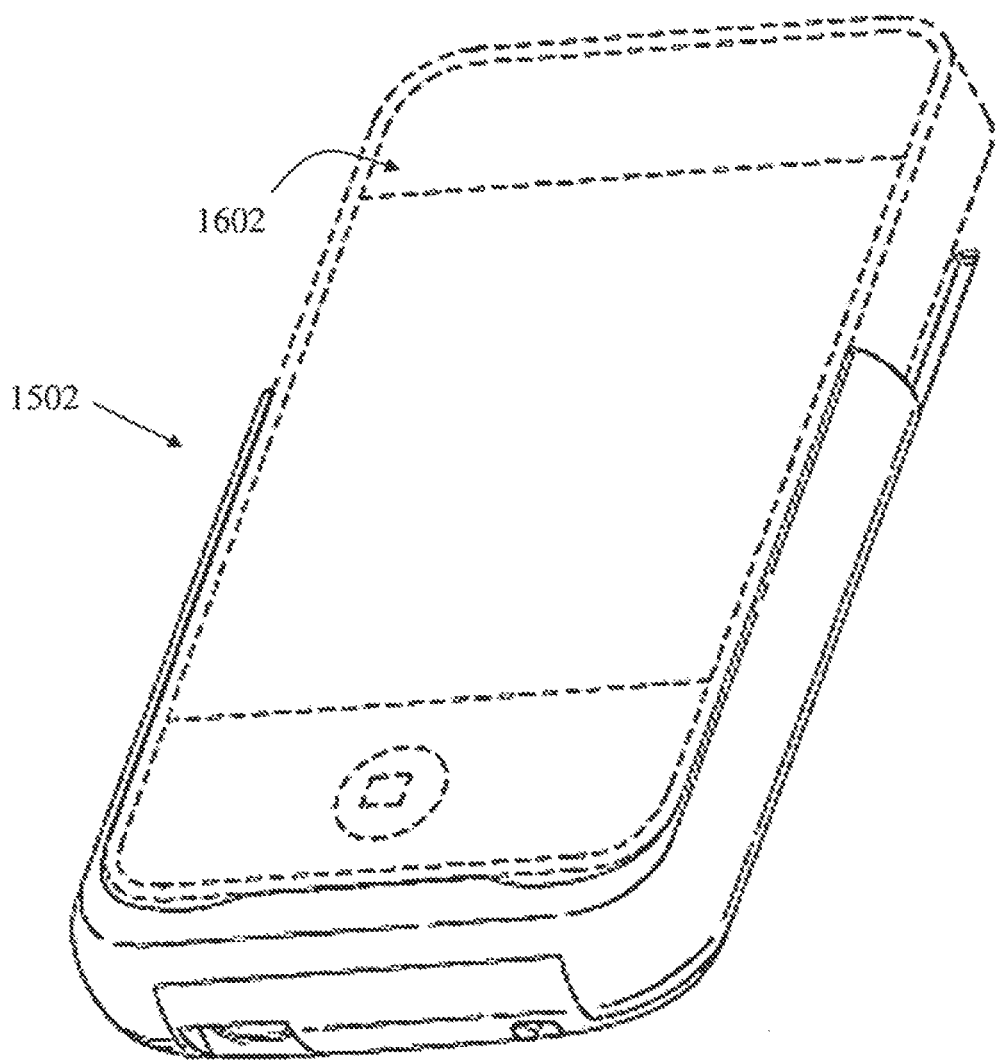
FIG. 16 illustrates a perspective view of the battery pack with a mobile device 1602 inserted therein.

FIG. 16 illustrates a perspective view of the battery pack 1502 with a mobile device 1602 inserted therein.

Figure 18:
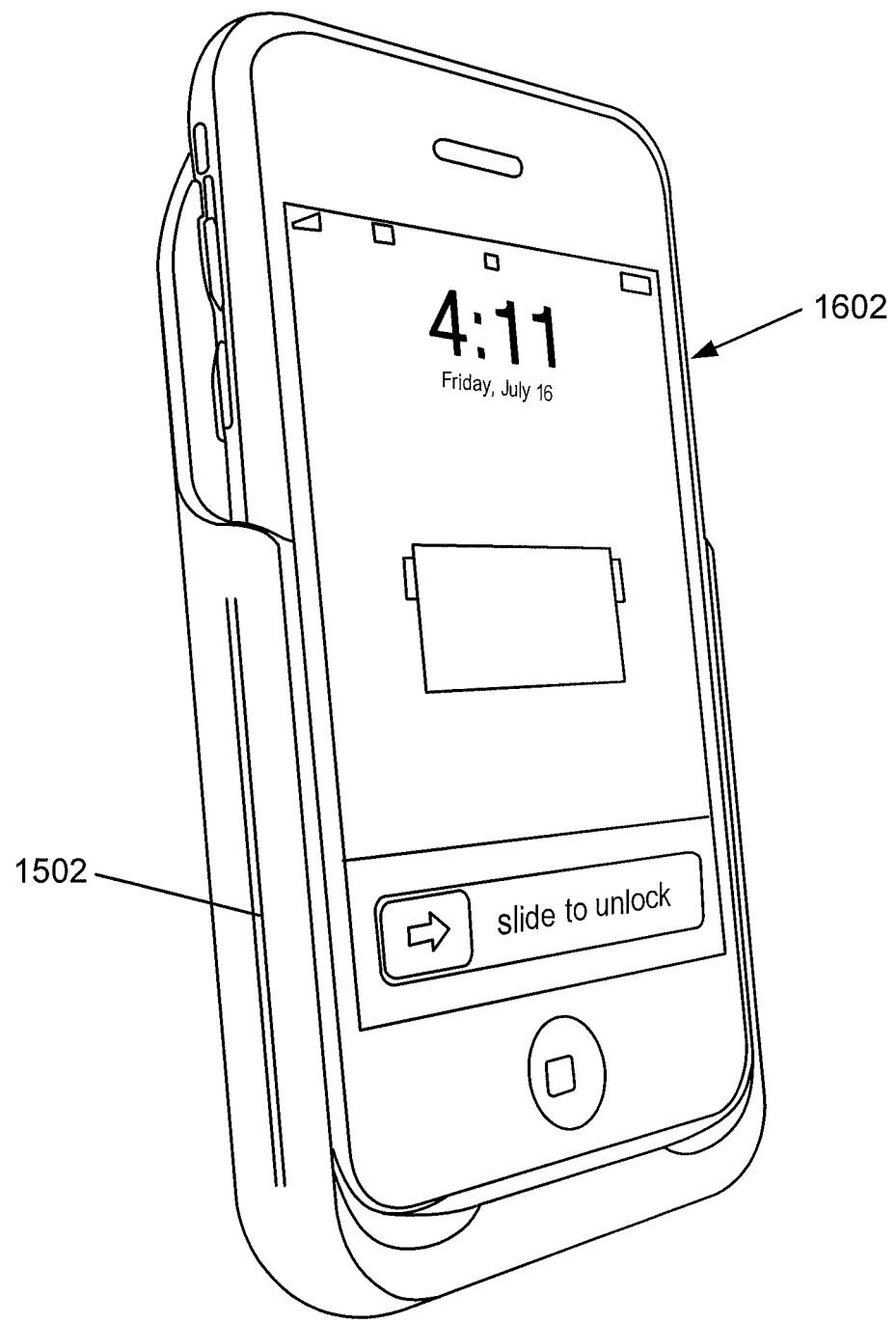
FIG. 18 illustrates another perspective view of the battery pack.

FIG. 18 illustrates another perspective view of the battery pack 1502.

Figure 19:
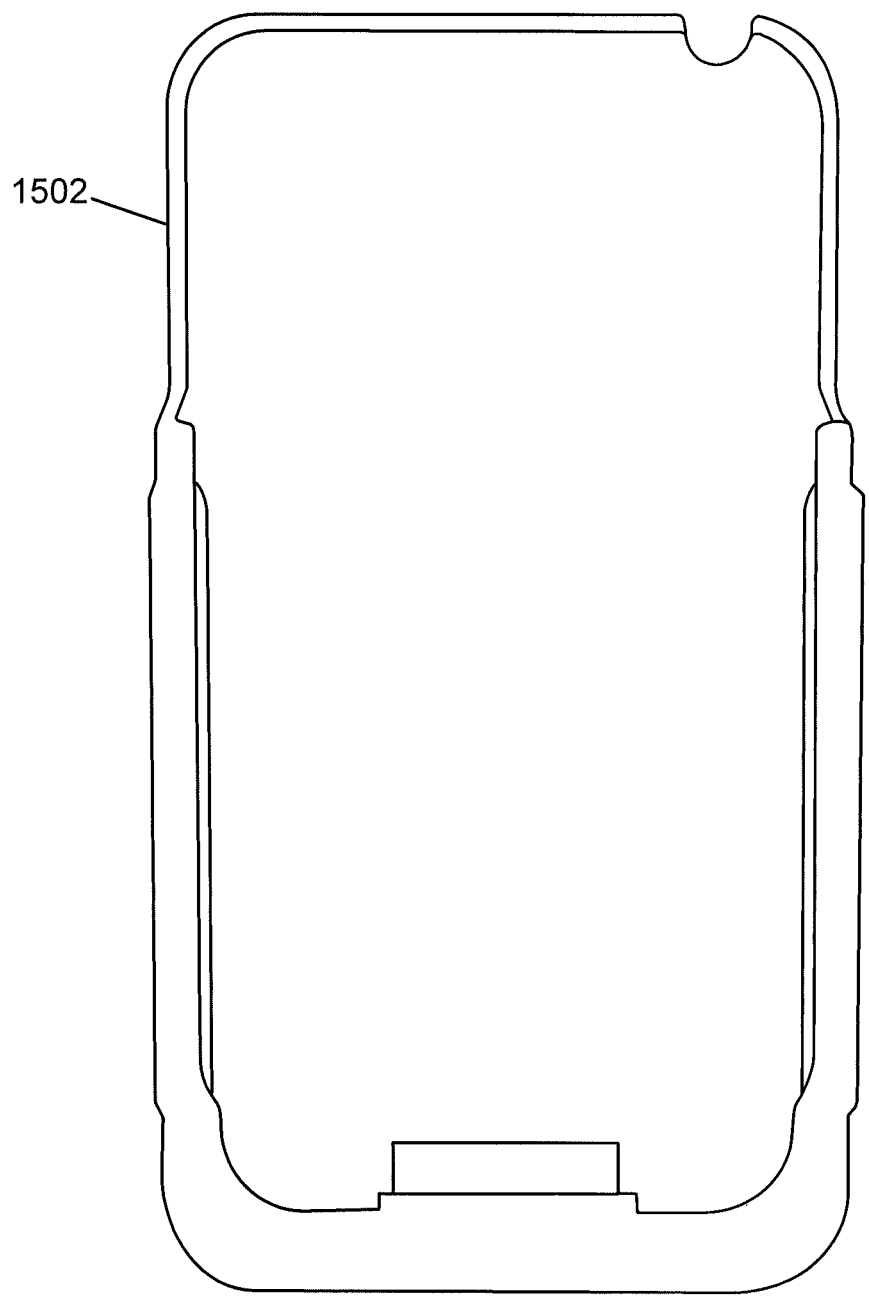
FIG. 19 illustrates a front view of the battery pack.

FIG. 19 illustrates a front view of the battery pack 1502.

Figure 20:
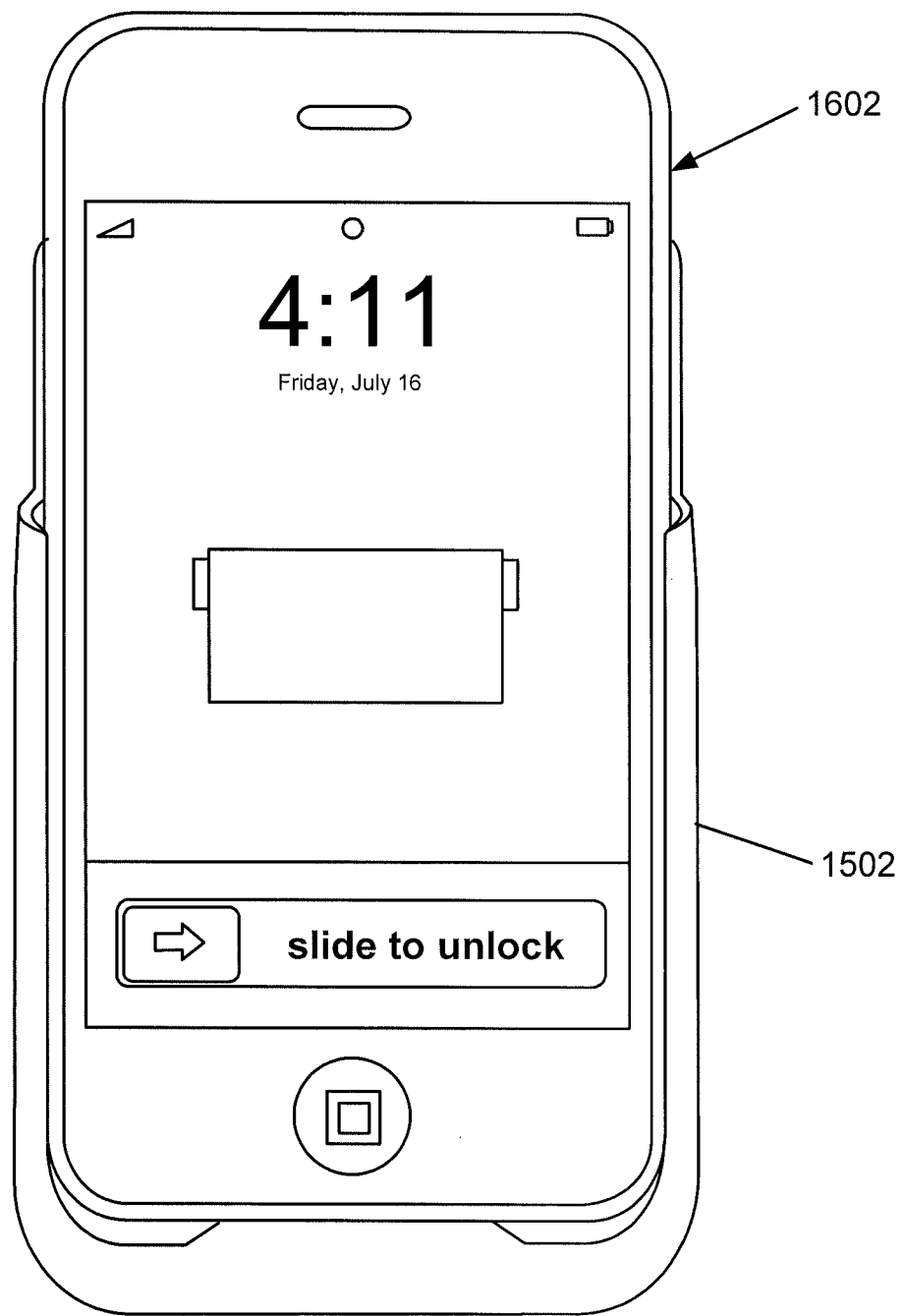
FIG. 20 illustrates a front view of the battery pack 1502 with the mobile device inserted therein.

FIG. 20 illustrates a front view of the battery pack 1502 with the mobile device inserted therein.

Figure 21:
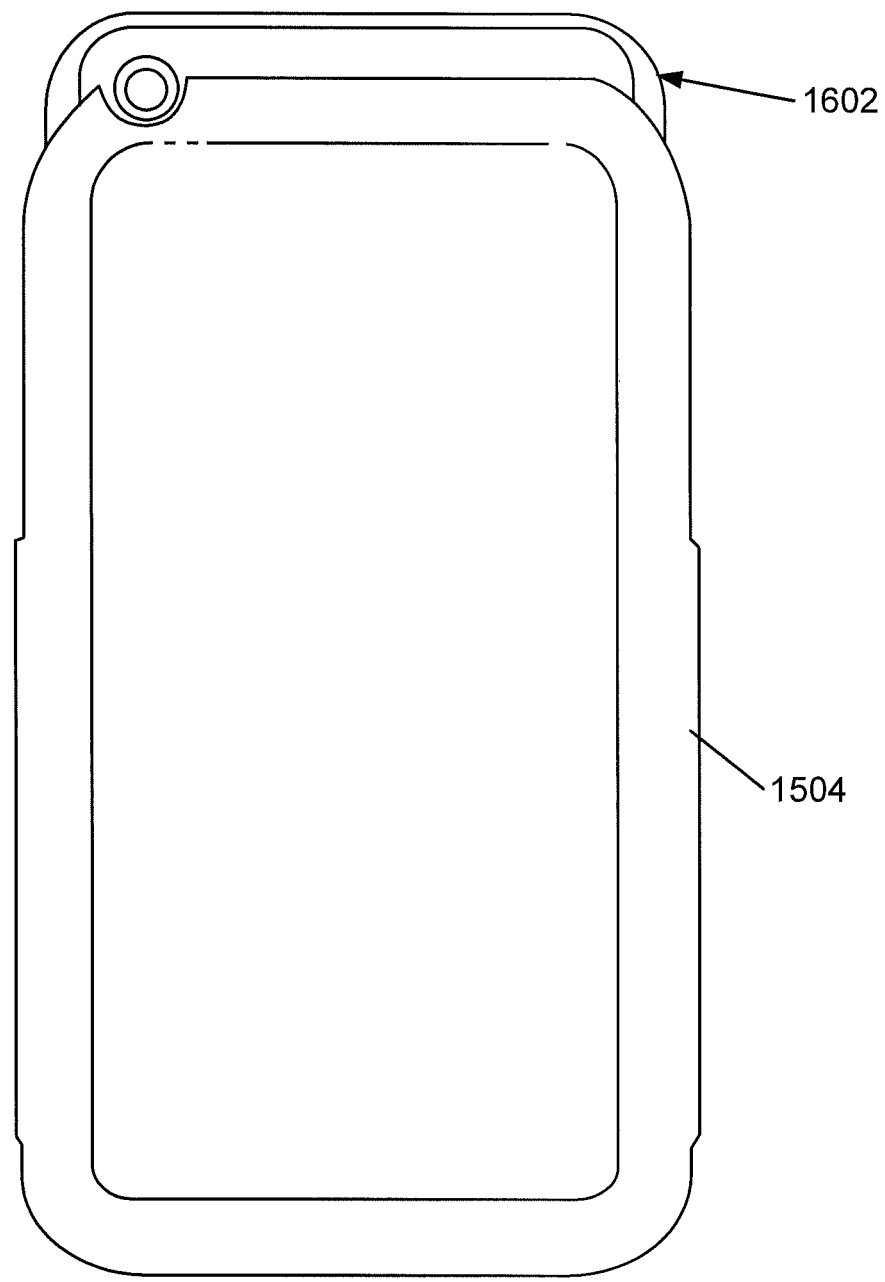
FIG. 21 illustrates a back view of the battery pack with the mobile device inserted therein.

FIG. 21 illustrates a hack view of the battery pack 1502 with the mobile device 1602 inserted therein.

Figure 22:
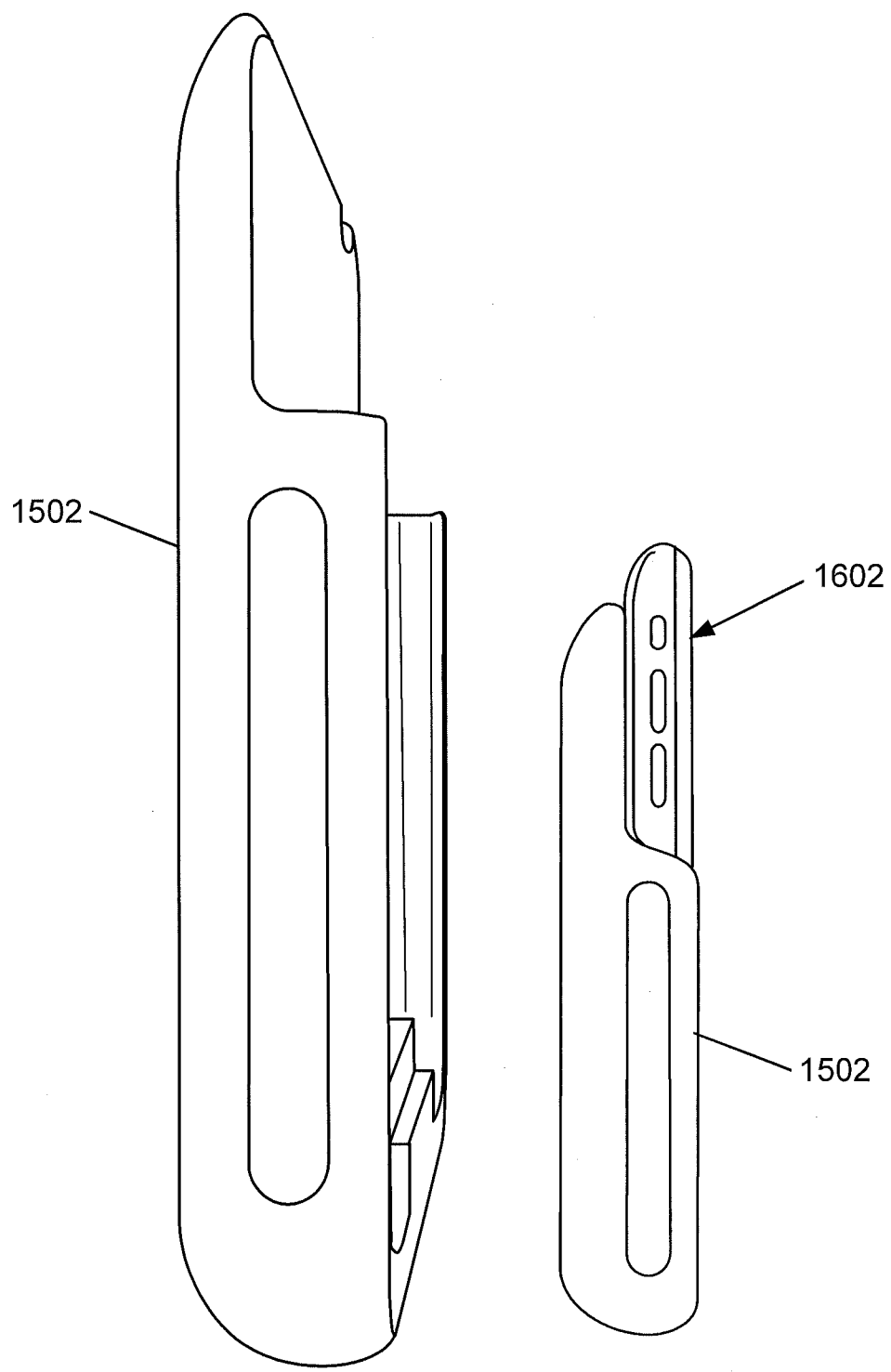
FIG. 22 illustrates a side view of the battery pack with and without the mobile device.

FIG. 22 illustrates a side view of the battery pack 1502 with and without the mobile device 1602. Note that, in some embodiments, the left and right sides may be symmetrical.

Extendible Processing and Interfacing Platform

Figure 17:
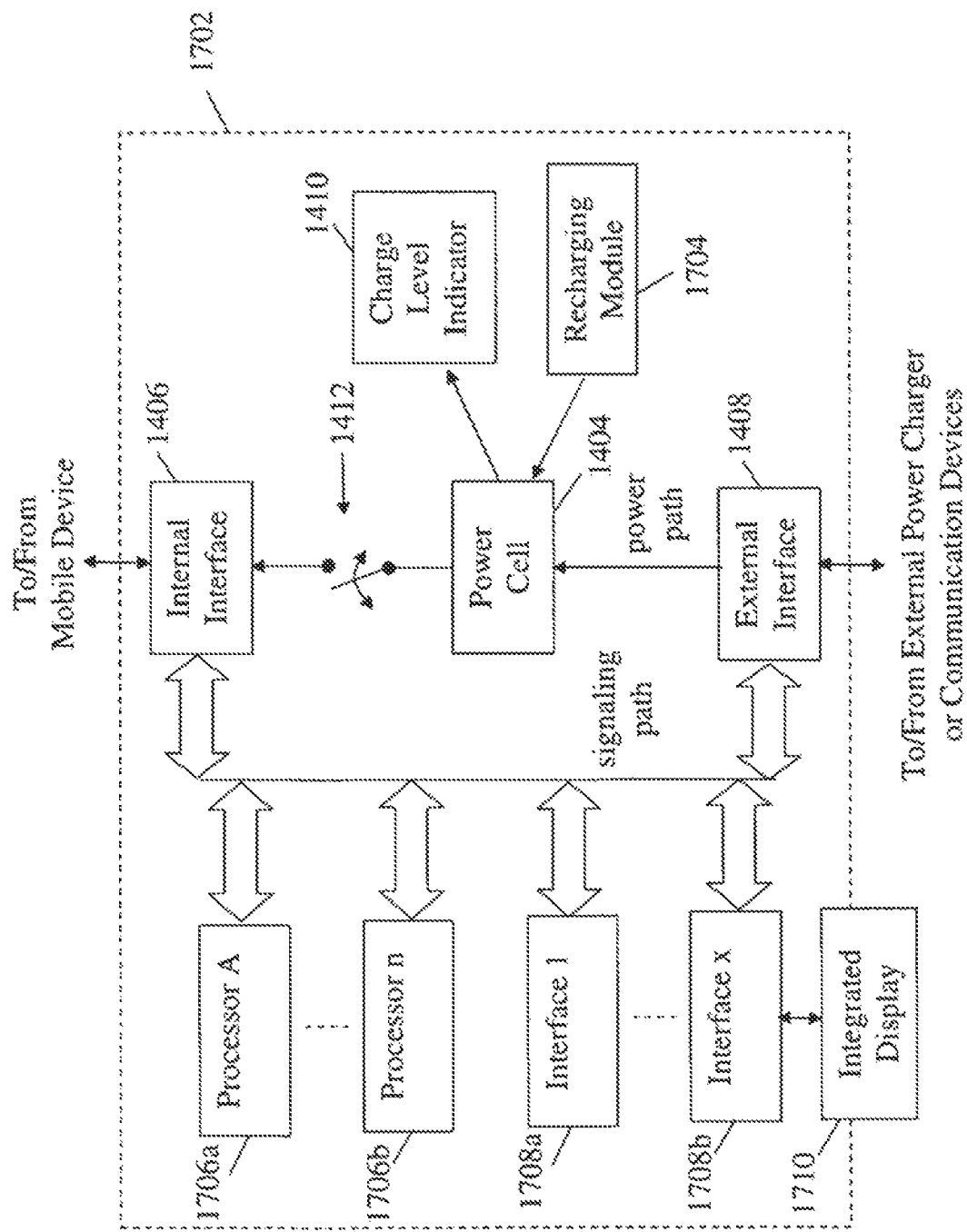
FIG. 17 illustrates a battery pack that also operates as an extendible processing and/or interfacing platform for a mobile device.

FIG. 17 illustrates a battery pack that also operates as an extendible processing and/or interfacing platform for a mobile device. In one example, the battery pack 1702 may operate as described with reference to FIG. 14. In addition, the battery pack may also include one or more processors 1706 and/or one or more interfaces 1708. The one or more processors 1706a and 1706b may allow a mobile device coupled to the internal interface 1406 to extend its processing capabilities. For instance, the mobile device may cause one or more applications to be executed on the one or more processors 1706 while using a user display on the mobile device as an output interface. Additionally, the processors 1706a and/or 1706b may be purpose-specific processors that allow the mobile device to perform particular tasks not otherwise possible on its own. For example, the processors 1706 may provide analog-to-digital conversion, audio signal sampling, temperature measuring, etc., which may not be available to the standard mobile device.

The one or more interfaces 1708a and 1708b may also provide the mobile device a means by which to communicate or acquire signals. These interfaces 1708 may effectively expand the communication interfaces available to the mobile device by providing wired and/or wireless communication interfaces for various types of signals (e.g., audio, infrared, etc.).

The battery pack 1702 may also include a recharging module 1704 that facilitates recharging of the power cell 1404. For example, the recharging module 1704 may be a wireless or cordless charging device that inductively or otherwise facilitates recharging of the power cell 1404.

In one example implementation, the battery pack 1702 may be adapted to function as a Medical Processing Unit which may have build-in capabilities for monitoring real-time health conditions (e.g., alcohol levels in breath, pulse, temperature, blood pressure, test and/or diagnose diabetes, etc.) via build-in test port. Consequently, the battery pack 1702 can collect and/or process such collected data and store it in the mobile device. Note that the processing of such data may be directed by an application that operates either on the one or more processors of the battery pack 1702 and/or the processor(s) of the mobile device. According to one feature, if an abnormal health condition occurs (e.g., a heart attack, fainting, seizure, etc.), the Medical Processing Unit may detect this condition and automatically activate the mobile device (e.g., cellular phone) to send urgent text message or entails to a doctor, hospital, or emergency responder. The responding party (doctor, hospital, emergency responder) may be able to locate the patient via a global positioning system or information from the mobile device.

In another example implementation, the battery pack 1702 may be adapted to function as a Gaming Processing Unit that may include the capability of turning the mobile device into a real handheld gaming device with joysticks or large PSP/DS type of gaming buttons and communication devices. Consequently, the mobile device may be configured to operate as an input and/or output interface (e.g., via a display on the mobile device or battery pack) for a game.

In yet another example, the battery pack 1702 may be adapted to function as a Home Entertainment Unit that may include the capability of turning the mobile device into a Universal Smart Remote Control which can control all the IR activated units in a home or office (e.g. control garage doors, television sets, security alarm, air conditioning, lighting, etc.). For this purpose, the battery pack 1702 may include various interfaces 1708 that provide the specific infrared and/or wireless protocols and/or signaling to control such devices.

Speakers & Microphone

Another feature may provide for one or more speakers to be included as part of the battery packs or holster (illustrated in FIGS. 1-22). For instance a low-profile speaker may be housed within the back plane of a battery pack so that the sound may be emitted from the rear or sides of the battery pack. When a mobile device is inserted and coupled to the battery pack, it couples to an interface that electrically connects the speaker to the mobile device. The mobile device may send audio or sound signals to the speaker via an interface with the battery pack. This allows a user to listen to audio stored in the mobile device without the need, for headphones.

Similarly, another feature may provide for one or more microphones to be included as part of the battery packs (illustrated in FIGS. 1-22). One or more microphones may be housed within the battery pack (e.g., hack plane) so that they may capture sound from a user. The microphone may be electrically coupled to an interface that allows sending captured audio signals to a mobile device that may be coupled to the battery pack.

According to yet another feature, when the mobile device is coupled to the battery pack 1702, it may cause one or more applications to execute on the processors 1706. These applications may continue to operate or execute even if the mobile device is removed or decoupled from the battery pack 1702. For example, the battery pack may continue to collect data (e.g., monitor medical conditions for a patient to which it is coupled) and wirelessly transmits the collected data or an alarm to the mobile device. This is possible since the processors 1706 may be powered by the power cell 1404 and can be configured to operate whether or not the mobile device is coupled to the battery pack.

Integrated Display

In some embodiments of the battery pack 1702, battery pack 1702 may also include an integrated display or screen. For example, the integrated display may be on the outer surface of the hack plane of the battery pack. Alternatively, the display 1710 may slide out from within the housing of the battery pack. This integrated display 1720 may allow displaying additional information or data to a user. The additional display screen may be electrically coupled to the mobile device (via an interface) to allow the mobile device to send images or video to the additional display screen.

In another example, the rear of the hack plane may house a Braille input and/or output interface that electrically coupled a mobile device mounted within the holster or battery pack.

In yet another embodiment, the rear of the hack plane may provide a keypad that serves as an input to the mobile device.

According to another feature, the battery pack and/or holster may provide an external interface (e.g., Bluetooth wireless interface, USB port, infrared port, etc.) that may allow the mobile device mounted in the battery pack and/or holster to communicate via that external interface. Thus the external interface may provide a different wireless interface than provided or supported by the internal system of the mobile device.

Consequently, a battery pack for a mobile communication device is provided comprising: (a) a casing or holster (e.g., FIG. 4, 402 and/or 404) defining a cavity (FIG. 1, 102) that conforms, at least partially, to the outer shape of the mobile communication device (FIG. 2, 202); and/or (h) one or more rechargeable power cells (FIG. 13, 1306) housed within the thickness (between 1302 and 1304) of the casing. The casing secures the mobile communication device (202) within the cavity (102) while at least one surface (e.g., a display screen) of the mobile communication device remains exposed. An internal interface (106) engages a corresponding interface on the mobile communication device to provide power from the one or more rechargeable cells (1306) to the mobile communication device. An external interface (FIG. 6, 602) electrically couples to the internal interface (106) to transmit signals from the mobile communication device to an external device. The external interface (602) may further serve to recharge the one or more rechargeable power cells. The casing further defines one or more access openings (104, 108, 110, 112) to permit access to integrated interfaces of the mobile communication device (202).

The battery pack (100 or 1502) may further include a recharging device (1704) integrated within the battery pack that wirelessly recharges the one or more rechargeable power cells (1306).

An extendible communication and/or processing platform may be provided to mobile communication device by the battery back. For instance, a plurality of communication interfaces (1708) may be coupled to the internal interface (106 or 1406), wherein the mobile communication device (202) can transmit and receive signals via the communication interfaces (1708). Similarly, at least one processor (1706) may be coupled to the internal interface (106 or 1406), and adapted to collect information via one or more interfaces (1708) of the battery pack and provide the collected information to the mobile communication device (202). At least one processor (1706) may be adapted to execute one or more instructions under the control of the mobile communication device (202). According to one feature, a display interface (1710) may be integrated into the battery pack to display information to a user.

The thickness of the battery pack (100 or 1502) is less than twice the thickness of the mobile communication device. In some embodiments, the thickness of the battery pack may extend, for example, between ten and ninety percent more than the thickness of the mobile communication device. For example, the battery pack may extend a mere thirty to fifty percent more than the thickness of the mobile communication device.

Similarly, a battery pack (100) for a mobile device (202) may include (a) a back plane (304), (h) a first and second sides (306 and 308). (c) a bottom side (312), wherein the hack plane (304) and first (306), second (308) and bottom (312) sides define a cavity (102) for mounting the mobile device (202); and (d) one or more battery cells (1306) housed within the thickness of the back plane (304). One or more speakers may be housed within the thickness of the hack plane (304) and electrically coupled to an interface (106) to allow a mobile device (202) mounted in the cavity (102) to send audio signals through the one or more speakers. Similarly, one or more microphones may be housed within the thickness of the back plane (304) and electrically coupled to an interface (106) to allow a mobile device (202) mounted in the cavity (102) to receive audio signals from the one or more microphones.

One or more of the features illustrated in FIGS. 1-22 may be rearranged and/or combined into a single component or embodied in several components. Additional components may also be added without departing from the invention.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

The following is claimed:

1. A case for a mobile device comprising:
    a bottom section comprising:
        a back wall upon which at least a portion of a back of a housing of the mobile device will be placed against, wherein the back wall comprises a top edge;
        a battery cell, enclosed in the bottom section;
        electronic circuitry, coupled to the battery cell;
        a bottom sidewall, connected to the back wall at an end opposite of the top edge, that will be positioned against at least a portion of a bottom side edge of the mobile device;
        an internal interface, on the bottom sidewall, positioned to connect to an interface on the mobile device, and coupled through the electronic circuitry to the battery cell; and
        an external interface, positioned on an outside of the bottom section, coupled through the electronic circuitry to the battery cell and internal interface; and
    a top section comprising:
        a top side that will be positioned against at least a portion of a top side edge of the mobile device when the top section is seated against the bottom section; and
        an open side end, opposite of the top side,
    wherein the top section slides onto the bottom section through the open side end,
    wherein when the top section is seated against the bottom section, the top and bottom sections meet at and form a seam, which extends across a back of the case, and
    when the top section is seated against the bottom section, a first open-polygon-shaped opening for the bottom section merges with a second open-polygon-shaped opening for the top section to form a front opening of the case through which a screen of the mobile device will be visible, the front opening having a closed shape.

2. The case of claim 1, wherein when the top section is seated against the bottom section to form the back of the case, the top section overlaps at least one portion of the bottom section to hold the top section to the bottom section.

3. The case of claim 1, wherein when the interface of the mobile device is connected to the internal interface of the bottom section and the screen of the mobile device faces up, the battery cell is positioned under the back of the housing of the mobile device.

4. The case of claim 1, wherein the bottom section comprises a plurality of lights, coupled to the electronic circuitry, and wherein the lights indicate a power or charge level for the battery cell.

5. The case of claim 1, further comprising a button on a back surface of the bottom section and coupled to the electronic circuitry.

6. The case of claim 1, wherein the bottom section comprises:
    a guide on a sidewall; and
    an insert section;
    wherein when the top section slides on the guide of the bottom section and over the insert section to attach to the bottom section, an edge of the top section overlaps with an edge of the bottom section to form the seam, and exterior surfaces of the bottom section and top section at the seam are flush with each other.

7. The case of claim 1, wherein the top section and the bottom section together substantially replicate an external shape of the mobile device.

8. The case of claim 1, wherein the bottom section comprises:
    a button, coupled to the electronic circuitry; and
    a plurality of lights, coupled to the electronic circuitry, and wherein the lights indicate a power or charge level for the battery cell.

9. The case of claim 1, wherein the battery cell can be charged via the external interface and wherein the mobile device, when coupled to the internal interface, can communicate with an external device via the external interface.

10. The case of claim 1, wherein the first open-polygon-shaped opening comprises a U shape and the second open-polygon-shaped opening comprises an upside-down U shape.

11. The case of claim 1, wherein the external interface comprises a micro USB port.

12. The case of claim 1, wherein the closed shape comprises a contoured rectangle shape.

13. A case for an electronic device comprising:
    a first case portion comprising:
        a base surface upon which at least a portion of a back of a housing of the electronic device will be placed against, wherein the base surface comprises a top edge;
        a battery, enclosed in the first case portion;
        electronic circuitry, coupled to the battery;

a bottom sidewall, connected to the base surface at an end opposite of the top edge, that will be positioned against at least a portion of a bottom side edge of the electronic device;

an inner connector, on the bottom sidewall, positioned to connect to a connector of the electronic device, and coupled through the electronic circuitry to the battery; and an outer connector, positioned on an outside of the first case portion, coupled through the electronic circuitry to the battery and the inner connector; and a second case portion comprising:

an upper sidewall that will be positioned against at least a portion of a top side edge of the electronic device when the second case portion is seated against the first case portion; and an open side end, opposite of the upper sidewall, wherein the second case portion slides onto the first case portion through the open side end, wherein when the second case portion is seated against the first case portion, the first and second case portions meet at and form a seam, which extends across a back of the case, and when the second case portion is seated against the first case portion, a first open-shaped opening for the first case portion merges with a second open-shaped opening for the second case portion to form a front opening of the case through which a screen of the electronic device will be visible, the front opening having a closed shape.

14. The case of claim 13, wherein the first case portion is a lower case portion and the second case portion is an upper case portion.

15. The case of claim 13, wherein when the connector of the electronic device is connected to the inner connector of the first case portion and the screen of the electronic device faces up, the battery is positioned under the back of the housing of the electronic device.

16. The case of claim 13, wherein the first case portion comprises a plurality of lights, coupled to the electronic circuitry, wherein the lights indicate a power or charge level for the battery.

17. The case of claim 13, wherein the first case portion comprises a button on a base back surface of the first case portion and coupled to the electronic circuitry.

18. The case of claim 13, wherein the first case portion comprises:

a guide on a sidewall; and an insert section;

wherein when the second case portion slides on the guide of the first case portion and over the insert section through the open side end to attach to the first case portion, an edge of the first case portion overlaps with an edge of the second case portion to form the seam, and exterior surfaces of the first case portion and second case portion at the seam become flush with each other.

19. The case of claim 13, wherein the second case portion and the first case portion together substantially replicate an external shape of the electronic device.

20. A case for a mobile device, the case comprising:
(i) a first case portion comprising:
  (1) a base comprising
    (a) a base front surface; and
    (b) a base back surface;
    Wherein at least a portion of a housing of a mobile device will be placed against the base front surface;
  (2) a battery cell, enclosed within a thickness of the base and between the base front surface and base back surface;
  (3) electronic circuitry, coupled to the battery cell, to an internal interface, and to an external interface, wherein the internal interface connects to an interface of the mobile device;
  (4) a guide on a sidewall; and
  (5) an insert section; and
(ii) a second case portion, slideable onto the first case portion;
wherein, when the second case portion slides on the guide of the first case portion and over the insert section to attach to the first case portion, edges of the first and second case portions overlap with each other to form a seam, and exterior surfaces of the first and second case portions at the seam become flush with each other;
wherein, when the second case portion is seated against the first case portion, the first and second case portions form the seam, which extends across a back of the case;
when the second case portion is seated against the first case portion, a first open-shaped opening for the first case portion merges with a second open-shaped opening for the second case portion to form a front opening of the case through which a screen of the mobile device will be visible, the front opening having a closed shape.

21. The case of claim 20, wherein when the interface of the mobile device is connected to the internal interface of the first case portion and the screen of the mobile device faces up, the battery cell is positioned under the back of the housing of the mobile device.

22. The case of claim 20, wherein the first case portion comprises a plurality of lights, coupled to the electronic circuitry, and wherein the lights indicate a power or charge level for the battery cell.

23. The case of claim 20, further comprising a button on a back surface of the first case portion and coupled to the electronic circuitry.

24. The case of claim 20, wherein the top first case portion and the second case portion together substantially replicate an external shape of the mobile device.

25. The case of claim 20, wherein the battery cell can be charged via the external interface and wherein the mobile device, when coupled to the internal interface, can communicate with an external device via the external interface.

26. The case of claim 20, wherein the first case portion is a lower case portion and the second case portion is an upper case portion.

* * * * *